US012763146B2

(12) United States Patent
Choi et al.

(10) Patent No.: US 12,763,146 B2
(45) Date of Patent: Oct. 13, 2026

(54) NAND FLASH MEMORY DEVICE WITH A REWRITE OPERATION AND OPERATING METHOD THEREOF

(71) Applicant: SAMSUNG ELECTRONICS CO., LTD., Suwon-si (KR)

(72) Inventors: Yonghyuk Choi, Suwon-si (KR); Seungbum Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 254 days.

(21) Appl. No.: 18/537,344

(22) Filed: Dec. 12, 2023

(65) Prior Publication Data

US 2024/0194268 A1 Jun. 13, 2024

(30) Foreign Application Priority Data

Dec. 12, 2022 (KR) ........................ 10-2022-0173062

(51) Int. Cl.
*G11C 16/08* (2006.01)
*G11C 16/04* (2006.01)
(Continued)

(52) U.S. Cl.
CPC ........ *G11C 16/102* (2013.01); *G11C 16/0433* (2013.01); *G11C 16/16* (2013.01); *G11C 16/08* (2013.01)

(58) Field of Classification Search
CPC .... G11C 16/102; G11C 16/0433; G11C 16/16
(Continued)

(56) References Cited

U.S. PATENT DOCUMENTS 8,614,917 B2 12/2013 Shim et al.
8,923,058 B2 12/2014 Lee et al.
(Continued)

FOREIGN PATENT DOCUMENTS

KR 10-2006-0120889 A 11/2006
KR 10-2020-0113063 A 10/2020

OTHER PUBLICATIONS

Communication issued on May 3, 2024 by the European Patent Office for European Patent Application No. 23215679.4.
(Continued)

*Primary Examiner* — Jason Lappas
(74) *Attorney, Agent, or Firm* — Sughrue Mion, PLLC

(57) ABSTRACT

A memory device is provided. The memory device includes: memory cells respectively connected with word lines; first ground selection transistors connected with a first ground selection line programmed to have a first threshold voltage; second ground selection transistors connected with a second ground selection line programmed to have a second threshold voltage which differs from the first threshold voltage; and a control circuit configured to: control an erase operation to be performed on each of at least one first ground selection transistor of the first ground selection transistors based on a threshold voltage of each of the at least one first ground selection transistor being greater than a predetermined first criterion; and control a threshold voltage of each of the second ground selection transistors to be compared with a predetermined second criterion based on the erase operation on the at least one first ground selection transistor being completed.

20 Claims, 16 Drawing Sheets

(51) Int. Cl.
*G11C 16/10* (2006.01)
*G11C 16/16* (2006.01)

(58) Field of Classification Search
USPC .................................................. 365/189.011
See application file for complete search history.

(56) References Cited

U.S. PATENT DOCUMENTS

| | | | |
|---|---|---|---|
| 9,589,640 B2 | 3/2017 | Moon et al. | |
| 9,747,997 B2 | 8/2017 | Lee et al. | |
| 9,978,453 B2 | 5/2018 | Lee | |
| 10,510,771 B2 | 12/2019 | Nam et al. | |
| 10,971,238 B2 * | 4/2021 | Kanamori | G11C 16/08 |
| 2012/0044759 A1 * | 2/2012 | Takahashi | G11C 16/0466 365/184 |
| 2012/0195125 A1 | 8/2012 | Choe et al. | |
| 2016/0343450 A1 | 11/2016 | Lee et al. | |
| 2019/0221267 A1 | 7/2019 | Ko et al. | |
| 2020/0202947 A1 | 6/2020 | Kim et al. | |

OTHER PUBLICATIONS

Communication issued Jul. 29, 2026 by the Korea Ministry of Intellectual Property Office in Korean Patent Application No. 10-2022-0173062.

* cited by examiner

FIG. 9

| [POR] | Coded-GSL #1 | Coded-GSL #2 | Coded-GSL #3 | Coded-GSL #4 |
|---|---|---|---|---|
| WL5 | Main | Main | Main | Main |
| WL4 | GDMY | GDMY | GDMY | GDMY |
| WL3 | Coded-GSL | Coded-GSL | GDMY | Coded-GSL |
| WL2 | GDMY | Coded-GSL | Coded-GSL | GDMY |
| WL1 | Coded-GSL | GDMY | GDMY | Coded-GSL |
| WL0 | GDMY | Coded-GSL | Coded-GSL | GDMY |
| DUM1 | DUM1 | Coded-GSL | GDMY | Coded-GSL |
| DUM0 | DUM0 | DUM0 | DUM0 | DUM0 |

NAND FLASH MEMORY DEVICE WITH A REWRITE OPERATION AND OPERATING METHOD THEREOF

CROSS-REFERENCE TO RELATED APPLICATION

This application claims priority to Korean Patent Application No. 10-2022-0173062, filed on Dec. 12, 2022, in the Korean Intellectual Property Office, the disclosure of which is incorporated by reference herein in its entirety.

BACKGROUND

The present disclosure relates to a memory device and an operating method thereof, and more particularly, to a non-volatile memory device and an operating method thereof, in which ground selection lines are controlled based on a predetermined criterion.

In semiconductor devices there is a continuous need for an increased degree of integration in order to increase capacity and reduce energy consumption.

To provide an increased degree of integration, three-dimensional semiconductor memory devices including transistors three-dimensionally arranged have been proposed. Technologies for decreasing a volume so as to increase the degree of integration of three-dimensional memory devices are being developed, and stability of memory devices is needed in proportion to an increase in degree of integration.

SUMMARY

One or more example embodiments provide a non-volatile memory device, which is programmed using a ground selection line (coded-GSL) scheme, and an operating method of the non-volatile memory device.

According to an aspect of an example embodiment, a memory device includes: a plurality of memory cells respectively connected with a plurality of word lines; a plurality of first ground selection transistors connected with a first ground selection line that is programmed to have a first threshold voltage; a plurality of second ground selection transistors connected with a second ground selection line that is programmed to have a second threshold voltage which differs from the first threshold voltage; and a control circuit configured to: control an erase operation to be performed on each of at least one first ground selection transistor of the plurality of first ground selection transistors based on a threshold voltage of each of the at least one first ground selection transistor being greater than a predetermined first criterion; and control a threshold voltage of each of the plurality of second ground selection transistors to be compared with a predetermined second criterion based on the erase operation on the at least one first ground selection transistor being completed.

According to another aspect of an example embodiment, an operating method of a memory device including memory blocks, each of the memory blocks including a plurality of cell strings connected in parallel between a bit line and a common source line, is provided. The operating method includes: programming a plurality of first ground selection transistors connected with a first ground selection line to have a first threshold voltage; programming a plurality of second ground selection transistors connected with a second ground selection line to have a second threshold voltage which differs from the first threshold voltage; based on a threshold voltage of each of at least one first ground selection transistor of the plurality of first ground selection transistors being greater than a predetermined first criterion, performing an erase operation each of on the at least one first ground selection transistor; and based on the erase operation on the at least one first ground selection transistor being completed, controlling a threshold voltage of each of the plurality of second ground selection transistors to be compared with a predetermined second criterion.

According to another aspect of an example embodiment, a memory device includes: a plurality of memory cells respectively connected with a plurality of word lines; a plurality of first ground selection transistors connected with a first ground selection line and programmed to have a first threshold voltage; a plurality of second ground selection transistors connected with a second ground selection line and programmed to have a second threshold voltage which differs from the first threshold voltage; and a control circuit configured to: based on a voltage region of at least one transistor of the plurality of second ground selection transistors being less than a predetermined second criterion, control an erase operation to be performed on each of plurality of second ground selection transistors that includes a region which is less than the predetermined second criterion.

BRIEF DESCRIPTION OF DRAWINGS

The above and other objects and features will be more apparent from the following description of example embodiments, taken in conjunction with the accompanying drawings, in which:

FIG. 9 is a diagram for describing an example embodiment of a case where a ground selection line of a memory device according to an example embodiment is programmed;

DETAILED DESCRIPTION

Example embodiments will be described more fully hereinafter with reference to the accompanying drawings, in which some example embodiments are shown. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation.

Figure 1:
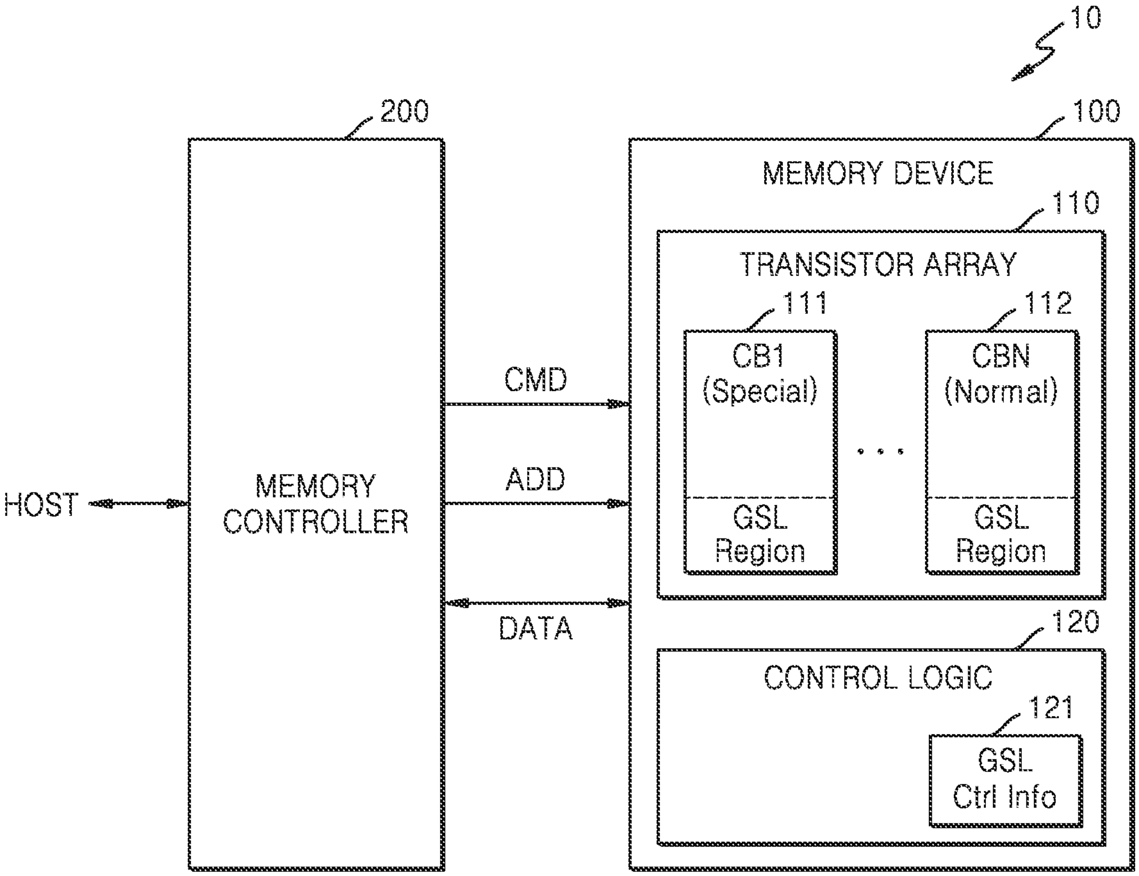
FIG. 1 is a block diagram of a memory system according to an example embodiment.

FIG. 1 is a block diagram of a memory system 10 according to an example embodiment.

Referring to FIG. 1, the memory system 10 may include a memory device 100 and a memory controller 200, and the memory device 100 may include a transistor array 110 and a control logic (i.e., control circuitry) 120. The memory device 100 may further include a voltage generator, which generates various voltages associated with programming/reading/erasing of data, and a page buffer and various other elements, which are connected with the transistor array 110 through bit lines. The transistor array 110 according to an example embodiment may be a memory cell array.

According to an example embodiment, the memory device 100 may include a non-volatile memory device. For example, the memory device 100 may include a non-volatile memory device, such as NAND flash memory, vertical NAND flash memory, NOR flash memory, resistive random access memory (RAM), phase-change memory, or magnetoresistive RAM. In some example embodiments, the memory device 100 or the memory system 10 may be implemented as an embedded memory embedded in an electronic device, or may be implemented as an external memory which is attachable or detachable on or from an electronic device. For example, the memory device 100 or the memory system 10 may be implemented as various types, such as a universal flash storage (UFS) memory device, an embedded multi-media card (eMMC), a solid state drive (SSD), a UFS memory card, a compact flash (CF) card, a secure digital (SD) card, a micro secure digital (micro-SD) card, a mini secure digital (mini-SD) card, an extreme digital (xD) card, and a memory stick.

In response to a write/read request from a host HOST, the memory controller 200 may read data stored in the memory device 100, or may control the memory device 100 to write (or program) data in the memory device 100. In detail, the memory controller 200 may provide an address ADD and a command CMD to the memory device 100, and thus, may control a program operation, a read operation, and an erase operation on the memory device 100. Also, data DATA to be written in the memory device 100 and data DATA read from the memory device 100 may be transferred and received between the memory controller 200 and the memory device 100.

The transistor array 110 may include a plurality of cell blocks CB1 to CBN. When the memory device 100 corresponds to a vertical NAND flash memory device, each of the plurality of cell blocks CB1 to CBN may include a plurality of cell strings. For example, a plurality of cell strings may be connected with one bit line, and in performing a data program/read operation, one cell string selected from among a plurality of cell strings may be electrically connected with a bit line.

The plurality of cell blocks CB1 to CBN may store various kinds of data. For example, the plurality of cell blocks CB1 to CBN may include special cell blocks 111 which store various pieces of information other than user data and normal cell blocks 112 which store the user data. According to an example embodiment, the normal cell blocks 112 and the special cell blocks 111 may be implemented to have different structures, or may be driven based on different schemes. The special cell blocks 111 according to an example embodiment may store various pieces of information associated with security. However, the kind of data stored in the special cell blocks 111 may vary according to example embodiments.

According to an example embodiment, each of the plurality of cell blocks CB1 to CBN may include a ground selection line (GSL) region where a plurality of ground selection lines GSL are arranged. For example, when a first cell block CB1 corresponds to the special cell block 111 and an Nth cell block CBN corresponds to the normal cell block 112, each of the first cell block CB1 and the Nth cell block CBN may include a GSL region. As described above, the GSL region of the first cell block CB1 and the GSL region of the Nth cell block CBN may physically have different structures. Alternatively, the GSL region of the first cell block CB1 and the GSL region of the Nth cell block CBN may be differently managed, and for example, management may be differently performed on a plurality of ground selection transistors (for example, GST of FIG. 2) connected with ground selection lines disposed in the GSL region of the first cell block CB1 and a plurality of ground selection transistors GST connected with ground selection lines disposed in the GSL region of the Nth cell block CBN. For example, a plurality of ground selection transistors GST included in each of the plurality of cell blocks CB1 to CBN may be programmed to have certain threshold voltages in a process of manufacturing the memory device 100, and threshold voltages of the ground selection transistors GST disposed in the GSL region of the first cell block CB1 and threshold voltages of the ground selection transistors GST disposed in the GSL region of the Nth cell block CBN may be differently programmed.

Furthermore, according to an example embodiment, the control logic 120 may include GSL control information 121. For example, the control logic 120 may include a fuse circuit, an anti-fuse circuit, and a certain storage circuit which is non-volatile and stores information. The control logic 120 may control a program operation on the plurality of ground selection transistors GST of the plurality of cell blocks CB1 to CBN, based on the GSL control information 121. In an example embodiment, the GSL control information 121 may be stored in the storage circuit of the control logic 120 in a process of manufacturing the memory device 100, or the GSL control information 121 may be provided to the control logic 120 in an initial driving process of the memory device 100.

Figure 2:
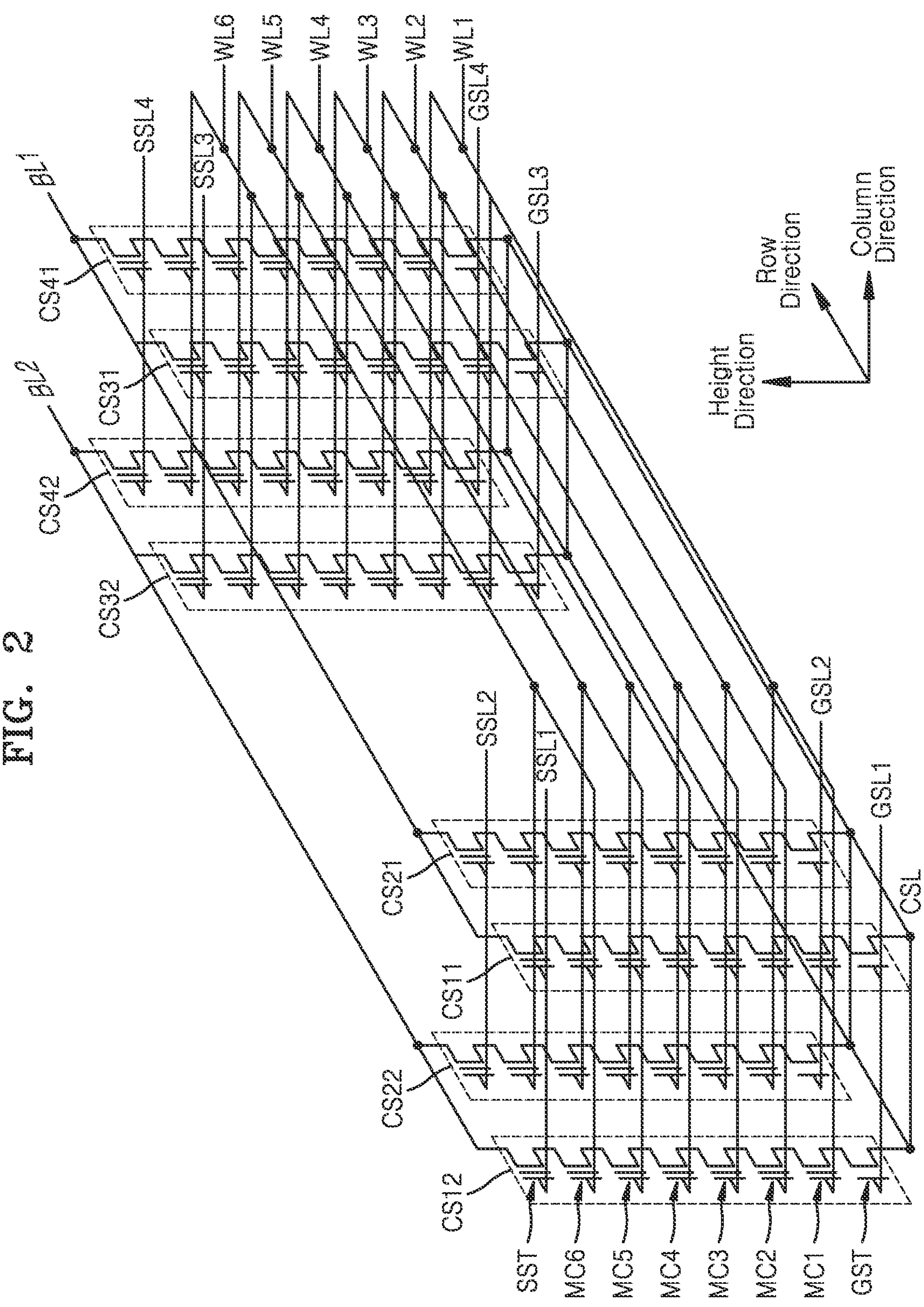
FIG. 2 is a circuit diagram illustrating a memory block BLKi included in a memory device according to an example embodiment.

FIG. 2 is a circuit diagram illustrating a memory block BLKi included in a memory device 100 according to an example embodiment.

Referring to FIG. 2, the memory block BLKi may include a plurality of cell strings CS11 to CS41 and CS12 to CS42. The plurality of cell strings CS11 to CS41 and CS12 to CS42 may be arranged in a row direction and a column direction to configure rows and columns.

Each of the plurality of cell strings CS11 to CS41 and CS12 to CS42 may include a ground selection transistor GST, memory cells MC1 to MC6, and a string selection transistor SST. The ground selection transistor GST, the memory cells MC1 to MC6, and the string selection transistor SST of each cell string may be stacked in a height direction perpendicular to an upper surface of a substrate.

The rows of the plurality of cell strings CS11 to CS41 and CS12 to CS42 may be respectively connected with different string selection lines. For example, the string selection transistors SST of the cell strings CS11 and CS12 may be connected with the string selection line SSL1 in common. The string selection transistors SST of the cell strings CS21 and CS22 may be connected with the string selection line SSL2 in common. The string selection transistors SST of the cell strings CS31 and CS32 may be connected with the string selection line SSL3 in common. The string selection transistors SST of the cell strings CS41 and CS42 may be connected with the string selection line SSL4 in common.

The columns of the plurality of cell strings CS11 to CS41 and CS12 to CS42 may be respectively connected with different bit lines BL1 and BL2. For example, the string selection transistors SST of the cell strings CS11 to CS41 may be connected with the bit line BL1 in common. The string selection transistors SST of the cell strings CS12 to CS42 may be connected with the bit line BL2 in common.

The rows of the plurality of cell strings CS11 to CS41 and CS12 to CS42 may be respectively connected with different ground selection lines GSL1 to GSL4. For example, the ground selection transistors GST of the cell strings CS11 and CS12 may be connected with the ground selection line GSL1 in common. The ground selection transistors GST of the cell strings CS21 and CS22 may be connected with the ground selection line GSL2 in common. The ground selection transistors GST of the cell strings CS31 and CS32 may be connected with the ground selection line GSL3 in common. The ground selection transistors GST of the cell strings CS41 and CS42 may be connected with the ground selection line GSL4 in common.

Memory cells disposed at the same height from the substrate (or ground selection transistors GST) may be connected with one word line in common, and memory cells disposed at different heights may be respectively connected with different word lines WL1 to WL6. For example, the memory cells MC1 may be connected with the word line WL1 in common. The memory cells MC2 may be connected with the word line WL2 in common. The memory cells MC3 may be connected with the word line WL3 in common. The memory cells MC4 may be connected with the word line WL4 in common. The memory cells MC5 may be connected with the word line WL5 in common. The memory cells MC6 may be connected with the word line WL6 in common.

The ground selection transistors GST of the cell strings CS11 to CS41 and CS12 to CS42 may be connected with a common source line CSL in common.

The memory block BLKi illustrated in FIG. 2 is an example. Example embodiments are not limited to the memory block BLKi illustrated in FIG. 2. For example, the number of rows of cell strings may increase or decrease. As the number of rows of cell strings is changed, the number of string selection lines connected with the rows of the cell strings and the number of cell strings connected with one bit line may be changed also. As the number of rows of cell strings is changed, the number of ground selection lines connected with the rows of the cell strings may be changed also.

The number of columns of cell strings may increase or decrease. As the number of columns of cell strings is changed, the number of bit lines connected with the columns of the cell strings and the number of cell strings connected with one string selection line may be changed also.

Heights of cell strings may increase or decrease. For example, the number of memory cells stacked on each of cell strings may increase or decrease. As the number of memory cells stacked on each cell string is changed, the number of word lines may be changed also. For example, the number of string selection transistors or ground selection transistors provided in each of cell strings may increase. As the number of string selection transistors or ground selection transistors provided in each of cell strings increases, the number of string selection lines or ground selection lines may be changed also. When the number of string selection transistors or ground selection transistors increases, the string selection transistors or the ground selection transistors may be stacked like the memory cells MC1 to MC6.

For example, a write operation and a read operation may be performed by row units of the cell strings CS11 to CS41 and CS12 to CS42. The cell strings CS11 to CS41 and CS12 to CS42 may be selected by one row units by using the ground selection lines GSL1 to GSL4, and the cell strings CS11 to CS41 and CS12 to CS42 may be selected by one row units by using the string selection lines SSL1 to SSL4. Also, a voltage may be applied to at least two ground selection lines GSL1 and GSL2 or GSL3 and GSL4 of the ground selection lines GSL1 to GSL4 by one unit. A voltage may be applied to all of the ground selection lines GSL1 to GSL4 by one unit. The ground selection lines GSL1 to GSL4 according to an example embodiment may be programmed to have a predetermined threshold voltage.

A write operation and a read operation may be performed, by page units, on a selected row of the cell strings CS11 to CS41 and CS12 to CS42. A page may be one row of memory cells connected with one word line. Memory cells may be selected in a selected row of the cell strings CS11 to CS41 and CS12 to CS42 by page units by using the word lines WL1 to WL6.

Figure 3:
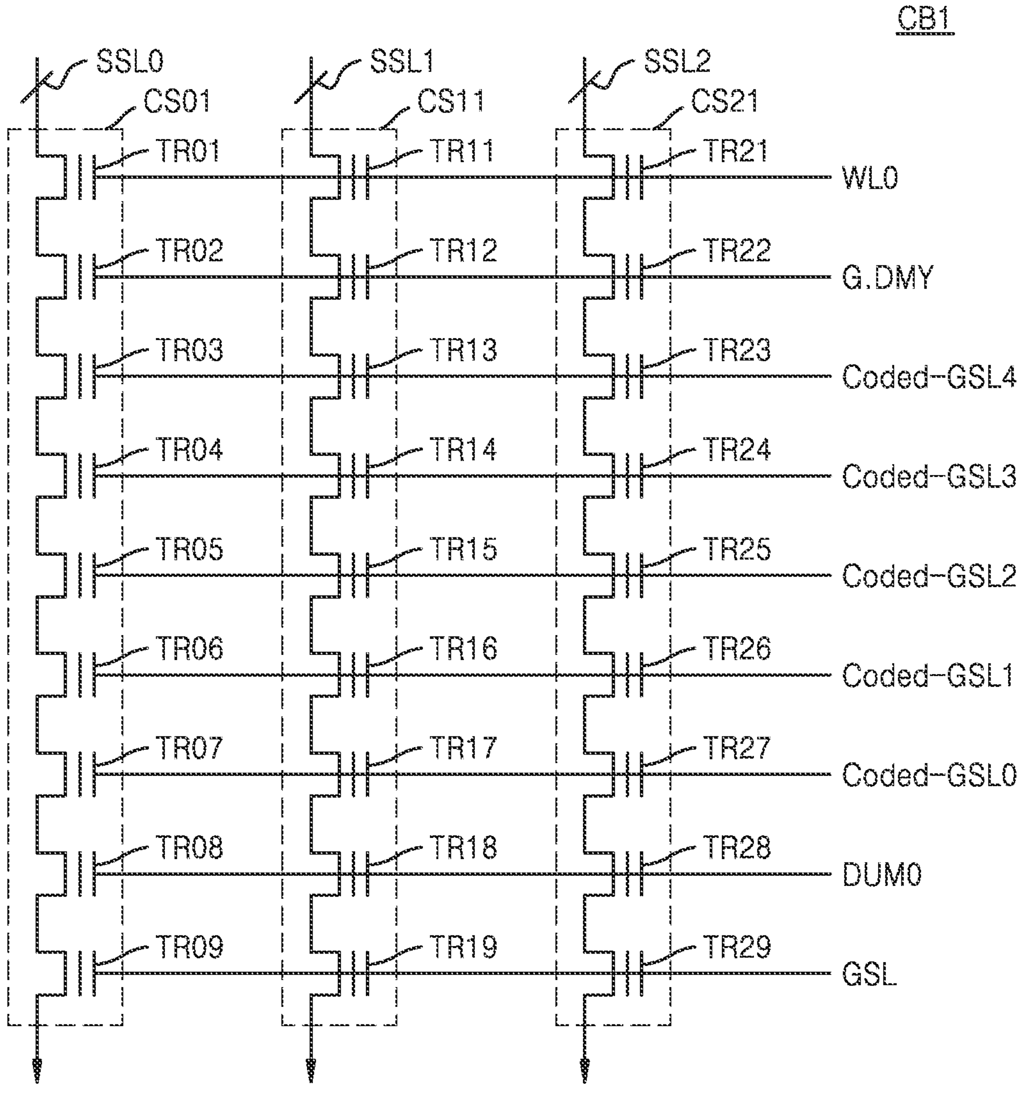
FIG. 3 is a circuit diagram for describing a configuration of a memory block included in a memory device according to an example embodiment.

FIG. 3 is a circuit diagram for describing a configuration of a memory block included in a memory device 100 according to an example embodiment. Hereinafter, a first cell memory block CB1 of memory blocks according to an example embodiment is described. However, cell blocks included in the memory device 100 are not limited thereto, and the memory device 100 may further include a plurality of cell blocks. Also, the memory device 100 according to an example embodiment may be a three-dimensional (3D) memory device.

Referring to FIG. 3, a first cell block CB1 according to an example embodiment may include a plurality of cell string regions CS01, CS11, and CS21, and the cell string regions CS01, CS11, and CS21 may be respectively connected with string selection lines SSL0, SSL1, and SSL2. For example, the first cell block CB1 may include a first cell string region CS01, a second cell string region CS11, and a third cell string region CS21. However, the number of cell string regions is not limited thereto, and the first cell block CB1 may further other numbers of cell string regions. Also, the first cell string region CS01 may be connected with a first string selection line SSL0, the second cell string region CS11 may be connected with a second string selection line SSL1, and the third cell string region CS21 may be connected with a third string selection line SSL2.

The cell string regions CS01, CS11, and CS21 according to an example embodiment may include a plurality of transistors TR01 to TR29. For example, the cell string regions CS01, CS11, and CS21 according to an example embodiment may be configured with the plurality of transistors TR01 to TR29. The first cell string region CS01, the second cell string region CS11, and the third cell string region CS21 according to an example embodiment may be connected with one another through a word line. For example, transistors of the first cell string region CS01, the second cell string region CS11, and the third cell string region CS21 may be respectively connected with different string selection lines.

A ground selection line GSL according to an example embodiment may activate transistors included in an arbitrary cell string region. For example, when an arbitrary cell string selection line SSL activates an arbitrary cell string, transistors of a region connected with a corresponding ground selection line GSL may be activated.

Some of word lines according to an example embodiment may be configured with programmed ground selection lines Coded-GSL0, Coded-GSL1, Coded-GSL2, Coded-GSL3, and Coded-GSL4 where a ground selection function is programmed. For example, the programmed ground selection lines Coded-GSL0, Coded-GSL1, Coded-GSL2, Coded-GSL3, and Coded-GSL4 may be programmed to have different threshold voltages and may control whether to activate the transistors of each cell string.

A ground dummy line G.DMY according to an example embodiment may be between the programmed ground selection lines Coded-GSL0, Coded-GSL1, Coded-GSL2, Coded-GSL3, and Coded-GSL4 and an adjacent word line WL0. Also, a dummy line DUM0 according to an example embodiment may be between the programmed ground selection lines Coded-GSL0, Coded-GSL1, Coded-GSL2, Coded-GSL3, and Coded-GSL4 and the ground selection line GSL. Because the ground dummy line G.DMY and the dummy line DUM0 are provided, the memory device 100 according to an example embodiment may perform stable ground selection line programming.

Figure 4:
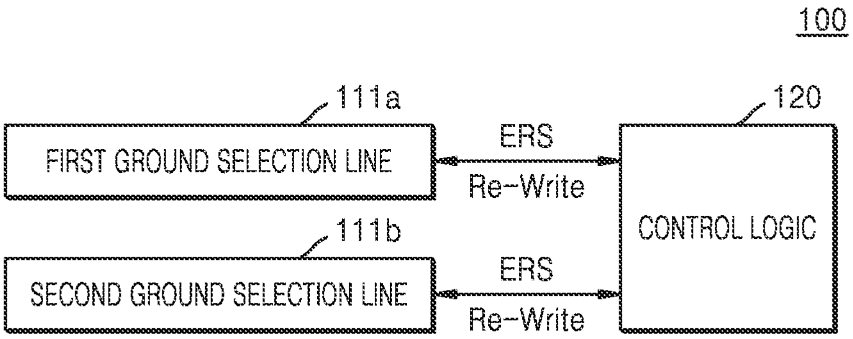
FIG. 4 is a block diagram of a memory device according to an example embodiment.

FIG. 4 is a block diagram of a memory device 100 according to an example embodiment.

Referring to FIG. 4, the memory device 100 according to an example embodiment may include a programmed first ground selection line 111*a* and a programmed second ground selection line 111*b* or a control logic 120.

According to an example embodiment, the programmed first ground selection line 111*a* and the programmed second ground selection line 111*b* may use some of word lines of a memory block. Each of transistors connected with the programmed first ground selection line 111*a* may be programmed to have a first threshold voltage. According to an example embodiment, each of transistors connected with the programmed second ground selection line 111*b* may be programmed to have a second threshold voltage. The second threshold voltage according to an example embodiment may be set to be different from the first threshold voltage. For example, the second threshold voltage may be set to have a value which is greater than that of the first threshold voltage.

The transistors connected with the programmed first ground selection line 111*a* according to an example embodiment may be referred to as first ground selection transistors, and the transistors connected with the programmed second ground selection line 111*b* may be referred to as second ground selection transistors.

The control logic 120 according to an example embodiment may perform an erase operation ERS and a rewrite operation Re-Write on each transistor. For example, the control logic 120 may determine whether a threshold voltage of at least one first ground selection transistor connected with the programmed first ground selection line 111*a* is greater than a predetermined first criterion. When the threshold voltage of the at least one first ground selection transistor connected with the programmed first ground selection line 111*a* is greater than the predetermined first criterion, the control logic 120 according to an example embodiment may determine that programming of the first threshold voltage fails. The first criterion according to an example embodiment may be a criterion for determining whether the first threshold voltage is normally set. For example, the first criterion may be an upper limit of the first threshold voltage which is preprogrammed.

When the threshold voltage of the at least one first ground selection transistor connected with the programmed first ground selection line 111*a* is greater than the predetermined first criterion, the control logic 120 according to an example embodiment may determine that programming of the first threshold voltage has failed and may perform the erase operation ERS on the first ground selection transistors having the threshold voltage which is greater than the first criterion. Before performing the erase operation ERS, by comparing the predetermined first criterion with the threshold voltage of each of the ground selection transistors connected with the programmed first ground selection line 111*a*, the memory device 120 according to an example embodiment may perform a stable erase operation ERS. Also, the memory device 120 according to an example embodiment may perform the erase operation ERS on transistors having a threshold voltage which is greater than the first criterion and may thus perform a stable rewrite operation later.

When an erase operation on the ground selection transistors connected with the programmed first ground selection line 111*a* is completed, the control logic 120 according to an example embodiment may compare a predetermined second criterion with voltages of a plurality of second ground selection transistors connected with the programmed second ground selection line 111*b*. The second criterion according to an example embodiment may be a lower limit of the second threshold voltage. When it is determined that a threshold voltage of each of second ground selection transistors connected with the programmed second ground selection line 111*b* is less than the second criterion, the control logic 120 according to an example embodiment may determine that programming of the second threshold voltage on the programmed second ground selection line 111*b* fails.

When an erase operation on a transistor connected with the programmed first ground selection line 111*a* is completed, the control logic 120 according to an example embodiment may perform a rewrite operation on first ground selection transistors having a threshold voltage which is less than the first criterion. For example, the control logic 120 may perform a rewrite operation on transistors where programming of the first threshold voltage has succeeded. When the threshold voltage of the at least one first ground selection transistor connected with the programmed first ground selection line 111*a* is less than the predetermined first criterion, the control logic 120 according to an example embodiment may perform the erase operation ERS on the first ground selection transistors.

The control logic 120 according to an example embodiment may perform the erase operation ERS on transistors where programming of the first threshold voltage has failed. For example, when a voltage region of the at least one first ground selection transistor connected with the programmed first ground selection line 111*a* is greater than the predetermined first criterion, the control logic 120 may perform the erase operation ERS on the first ground selection transistors. When there are first ground selection transistors where programming of the first threshold voltage has failed, the control logic 120 according to an example embodiment may perform the erase operation ERS on all of the first ground selection transistors where programming of the first threshold voltage has succeeded and the first ground selection transistors where programming of the first threshold voltage has failed. By performing the erase operation ERS on all of the first ground selection transistors where programming of the first threshold voltage has succeeded and the first ground selection transistors where programming of the first threshold voltage has failed, the control logic 120 according to an example embodiment may perform a stable rewrite operation and may maintain the robustness of the ground selection line.

When an erase operation on the first ground selection transistors is completed, the control logic 120 according to an example embodiment may determine whether programming of a threshold voltage of each of a plurality of second ground selection transistors connected with the programmed second ground selection line 111*b* has succeeded and may perform the erase operation ERS.

For example, the control logic 120 may perform the erase operation ERS on second ground selection transistors where programming of the second threshold voltage has failed. When an erase operation on the second ground selection transistors is completed, the control logic 120 according to an example embodiment may determine a rewrite operation on the second ground selection transistors. When it is determined that programming of a threshold voltage of at least one transistor of the plurality of second ground selection transistors connected with the programmed second ground selection line 111*b* has failed, the control logic 120 according to an example embodiment may perform a rewrite operation on all transistors connected with the programmed second ground selection line 111*b* and may thus perform a stable rewrite operation.

When there are a plurality of transistors, including a region which is greater than the first criterion, of the second ground selection transistors connected with the programmed second ground selection line 111*b*, the control logic 120 according to an example embodiment may perform a first rewrite operation on the second ground selection transistors connected with the programmed second ground selection line 111*b*, and when the first rewrite operation is completed, a second rewrite operation may be performed on the first ground selection transistors connected with the programmed first ground selection line 111*a*. The first rewrite operation according to an example embodiment may be an operation of re-setting threshold voltages of the second ground selection transistors, and the second rewrite operation may be an operation of re-setting threshold voltages of the first ground selection transistors.

For example, when programming of the first threshold voltage and programming of the second threshold voltage have all failed, the amount of shift of the second threshold voltage may be greater than the amount of shift of the first threshold voltage in performing a rewrite operation. The control logic 120 according to an example embodiment may first perform a rewrite operation on the second threshold voltage where the amount of shift is relatively high and may perform a rewrite operation on the first threshold voltage after the rewrite operation on the second threshold voltage is completed, and thus, may perform a stable rewrite operation.

A rewrite operation according to an example embodiment may be performed based on a predetermined criterion. For example, the control logic 120 may previously program an order of rewrite operations, and when a plurality of transistors occur where programming of threshold voltages has failed, the control logic 120 may perform a first rewrite operation and may then perform a second rewrite operation when the first rewrite operation is completed.

Figure 5:
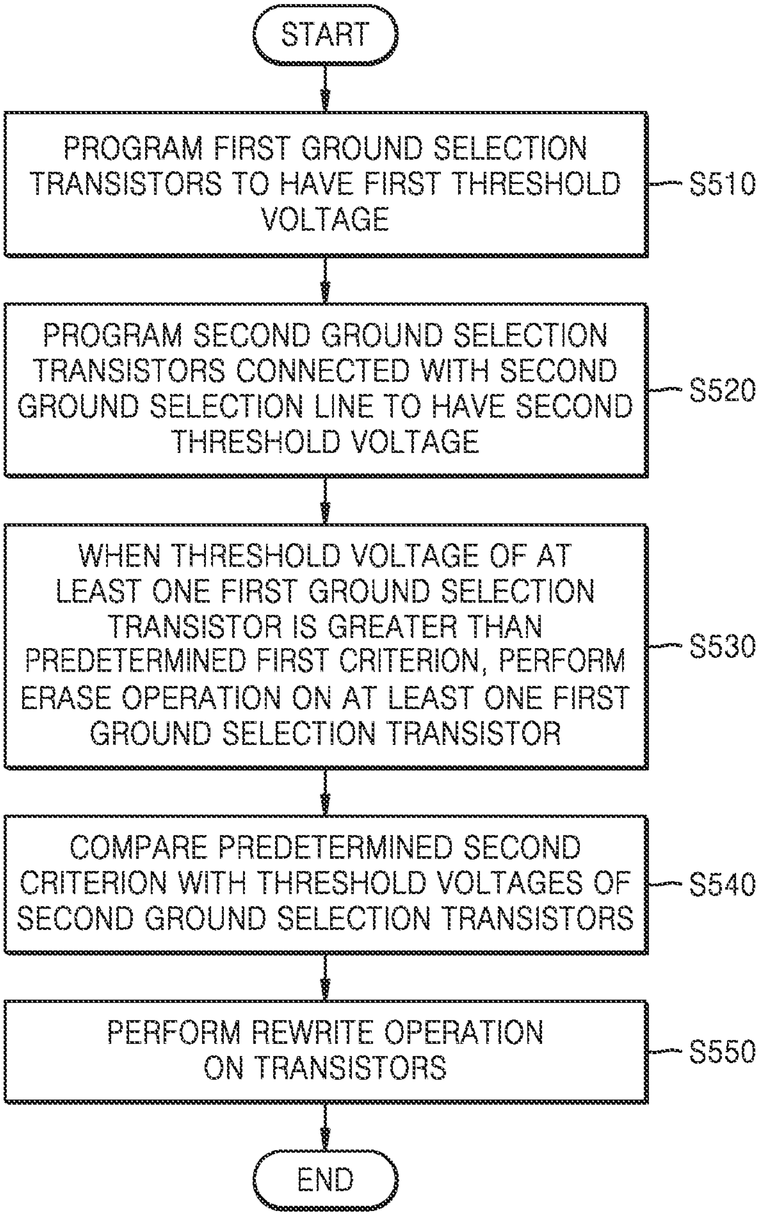
FIG. 5 is a flowchart of an operating method of a memory device, according to an example embodiment.

FIG. 5 is a flowchart of an operating method of a memory device 100, according to an example embodiment.

Referring to FIG. 5, the memory device 100 according to an example embodiment may be programmed so that a plurality of first ground selection transistors have the first threshold voltage, in operation S510. For example, each of a plurality of first ground selection transistors connected with the programmed first ground selection line 111*a* may be programmed to have the first threshold voltage.

When the plurality of first ground selection transistors are programmed to have the first threshold voltage, each of a plurality of second ground selection transistors connected with the programmed second ground selection line 111*b* may be programmed to have the second threshold voltage, in operation S520.

The programmed second ground selection line 111*b* according to an example embodiment may include at least one of word lines of a word line block and may be configured to have the second threshold voltage. For example, each of transistors provided in the programmed second ground selection line 111*b* may be programmed to have the second threshold voltage. The second threshold voltage according to an example embodiment may be set to be different from the first threshold voltage. For example, the second threshold voltage may be set to have a value which is greater than that of the first threshold voltage. The first threshold voltage according to an example embodiment may be a threshold voltage having a lower state, and the second threshold voltage may be a threshold voltage having an upper state. For example, the first threshold voltage may have an average of −2 V, and the second threshold voltage may have an average of +2 V.

When the plurality of first ground selection transistors connected with the programmed first ground selection line 111*a* are programmed to have the second threshold voltage and a threshold voltage of at least one first ground selection transistor is greater than the predetermined first criterion, an erase operation on the at least one first ground selection transistor may be performed by the memory device 100 according to an example embodiment in operation S530.

For example, the memory device 100 may determine whether there is a region, which is greater than the predetermined criterion, of a voltage region of at least one transistor connected with the programmed first ground selection line 111*a*. When it is determined that there is a transistor, which is greater than the predetermined first criterion, of a voltage region of at least one transistor connected with the programmed first ground selection line 111*a*, the memory device 100 according to an example embodiment may determine that programming of the first threshold voltage has failed. The first criterion according to an example embodiment may be a criterion for determining whether the first threshold voltage is normally set. For example, the first criterion may be an upper limit of the first threshold voltage which is preprogrammed. When it is determined that there is a region, which is greater than the predetermined first criterion, of a voltage region of at least one transistor connected with the programmed first ground selection line 111*a*, the memory device 100 according to an example embodiment may determine that programming of the first threshold voltage has failed and may perform an erase operation ERS on the first ground selection transistors having the threshold voltage which is greater than the first criterion.

When an erase operation is performed on at least one first ground selection transistor, the memory device 100 according to an example embodiment may compare a predetermined second criterion with threshold voltages of a plurality of second ground selection transistors in operation S540.

When an erase operation on a transistor connected with the programmed first ground selection line 111*a* is completed, the memory device 100 according to an example embodiment may determine whether programming of a threshold voltage of each of transistors connected with the programmed second ground selection line 111*b* has succeeded and may perform the erase operation ERS. The second criterion according to an example embodiment may be a lower limit of the second threshold voltage. When it is determined that there is a region, which is less than the second criterion, of a voltage region of each of transistors connected with the programmed second ground selection line 111*b*, the memory device 100 according to an example embodiment may determine that programming of the second threshold voltage on the programmed second ground selection line 111*b* has failed.

When a threshold voltage of each of transistors connected with the programmed second ground selection line 111*b* is compared with the predetermined second criterion, the memory device 100 according to an example embodiment may perform control so that a rewrite operation on transistors is performed.

For example, the memory device 100 may perform a rewrite operation on transistors where programming of the first threshold voltage has succeeded. In this case, when a voltage region of at least one transistor connected with the programmed first ground selection line 111*a* is less than the predetermined first criterion, the memory device 100 according to an example embodiment may perform an erase operation ERS on the transistors connected with the programmed first ground selection line 111*a* and may perform a rewrite operation.

The memory device 100 according to an example embodiment may perform an erase operation ERS on transistors where programming of the first threshold voltage has failed. For example, when the voltage region of the at least one transistor connected with the programmed first ground selection line 111*a* is greater than the predetermined first criterion, the memory device 100 may perform an erase operation ERS on all transistors connected with the programmed first ground selection line 111*a*. When there are transistors where programming of the first threshold voltage has failed, the memory device 100 according to an example embodiment may perform an erase operation ERS on all of transistors where programming of the first threshold voltage has succeeded and transistors where programming of the first threshold voltage has failed. By performing the erase operation ERS on all of the transistors where programming of the first threshold voltage has succeeded and the transistors where programming of the first threshold voltage has failed, the memory device 100 according to an example embodiment may perform a stable rewrite operation and may maintain the robustness of a ground selection line.

The memory device 100 according to an example embodiment may perform a rewrite operation on transistors connected with the programmed second ground selection line 111*b*. When it is determined that programming of a threshold voltage of at least one transistor of transistors connected with the programmed second ground selection line 111*b* has failed, the memory device 100 according to an example embodiment may perform a rewrite operation on all transistors connected with the programmed second ground selection line 111*b* and may thus perform a stable rewrite operation.

Figure 6:
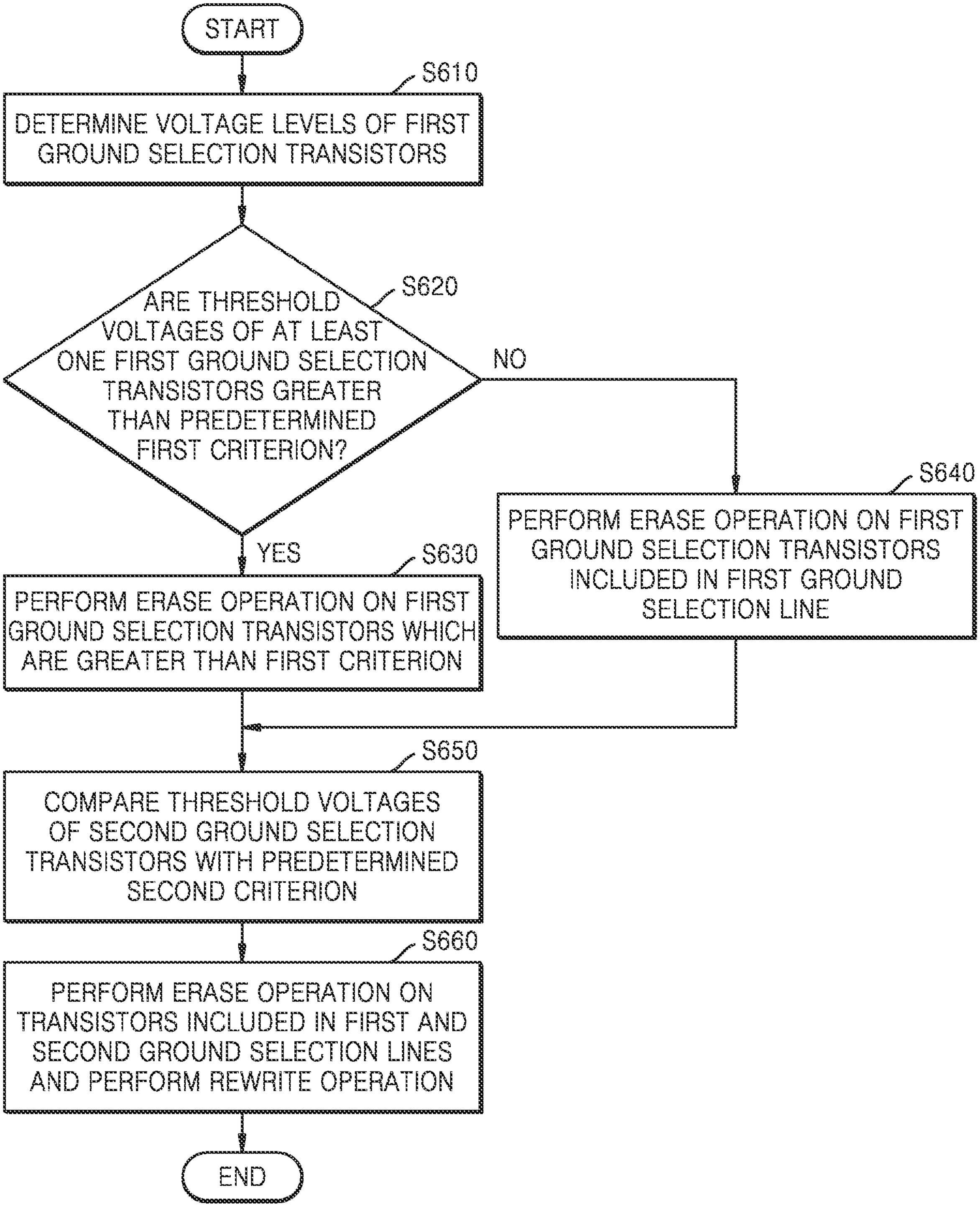
FIG. 6 is a flowchart of a process of performing an erase operation on ground selection lines in an operating method of a memory device, according to an example embodiment.

FIG. 6 is a flowchart of a process of performing an erase operation on ground selection lines in an operating method of a memory device 100, according to an example embodiment.

Referring to FIG. 6, the memory device 100 according to an example embodiment may determine a voltage level of each of first ground selection transistors in operation S610.

For example, the memory device 100 may determine a threshold voltage distribution of each of transistors connected with the programmed first ground selection line 111*a*. The memory device 100 according to an example embodiment may calculate an average value of the threshold voltage distribution of each transistor and may determine the calculated average value as a voltage level of a corresponding transistor.

When a voltage level of each of the first ground selection transistors is determined, the memory device 100 according to an example embodiment may determine whether a threshold voltage of at least one first ground selection transistor is greater than the predetermined first criterion in operation S620.

The first criterion according to an example embodiment may be a criterion for determining whether the first threshold voltage is normally set. For example, the first criterion may be an upper limit of the first threshold voltage which is preprogrammed. When it is determined that there is a transistor, which has a threshold voltage that is greater than the predetermined first criterion, of a voltage region of at least one transistor connected with the programmed first ground selection line 111*a*, the memory device 100 according to an example embodiment may determine that programming of the first threshold voltage has failed.

When it is determined that there is a region where the threshold voltage of the first ground selection transistor is greater than the predetermined first criterion, the memory device 100 according to an example embodiment may perform an erase operation on first ground selection transistors having a threshold voltage which is greater than the predetermined first criterion.

However, when it is determined that there is no region where the threshold voltage of the first ground selection transistor is greater than the predetermined first criterion, the memory device 100 according to an example embodiment may perform an erase operation on first ground selection transistors connected with a first ground selection line in operation S640.

When there are transistors where programming of the first threshold voltage has failed, the memory device 100 according to an example embodiment may perform an erase operation ERS on transistors selected from among transistors where programming of the first threshold voltage has succeeded and transistors where programming of the first threshold voltage has failed. Also, the memory device 100 according to an example embodiment may perform an erase operation ERS on all transistors connected with the programmed first ground selection line 111*a*. By performing the erase operation ERS on all of the transistors where programming of the first threshold voltage has succeeded and the transistors where programming of the first threshold voltage has failed, the memory device 100 according to an example embodiment may perform a stable rewrite operation and may maintain the robustness of a ground selection line.

When an erase operation ERS is performed on first ground selection transistors, the memory device 100 according to an example embodiment may compare the predetermined second criterion with threshold voltages of a plurality of second ground selection transistors in operation S650.

The second criterion according to an example embodiment may be a lower limit of the second threshold voltage. When it is determined that there is a region, which is less than the second criterion, of a voltage region of each of transistors connected with the programmed second ground selection line 111*b*, the memory device 100 according to an example embodiment may determine that programming of the second threshold voltage on the programmed second ground selection line 111*b* has failed.

When the predetermined second criterion is compared with threshold voltages of a plurality of second ground selection transistors, the memory device 100 according to an example embodiment may perform an erase operation ERS on first and second ground selection transistors in operation S660.

For example, the memory device 100 may perform a rewrite operation on transistors where programming of the first threshold voltage has succeeded. In this case, when a voltage region of at least one transistor connected with the programmed first ground selection line 111*a* is less than the predetermined first criterion, the memory device 100 according to an example embodiment may perform an erase operation ERS on the transistors connected with the programmed first ground selection line 111*a* and may perform a rewrite operation. The memory device 100 according to an example embodiment may perform a rewrite operation on transistors connected with the programmed second ground selection line 111*b*. When it is determined that programming of a threshold voltage of at least one transistor of transistors connected with the programmed second ground selection line 111*b* has failed, the memory device 100 according to an example embodiment may perform a rewrite operation on all transistors connected with the programmed second ground selection line 111*b* and may thus perform a stable rewrite operation.

Figure 7:
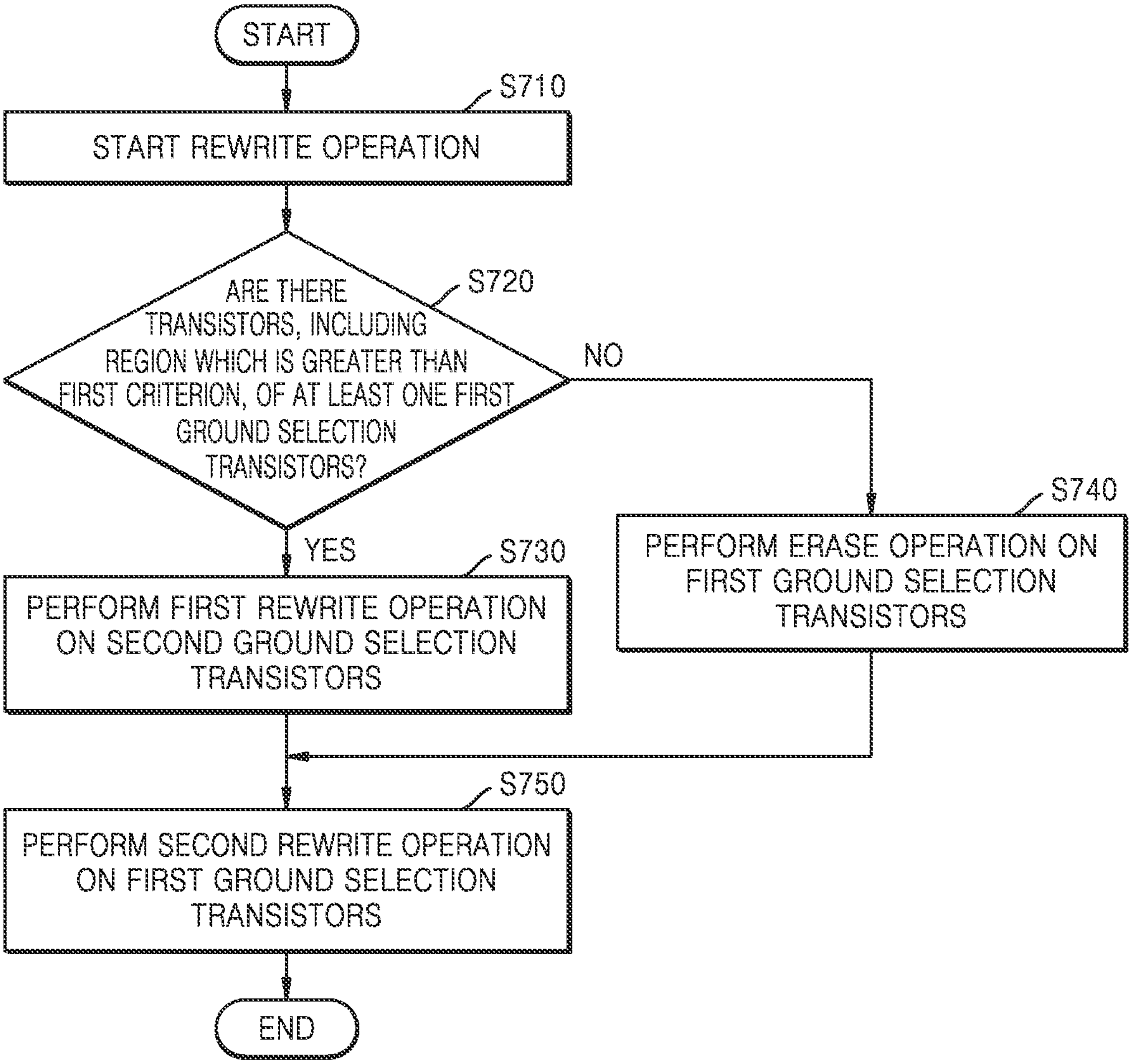
FIGS. 7 and 8 are flowcharts of a process of performing a rewrite operation in an operating method of a memory device, according to an example embodiment.
Figure 8:
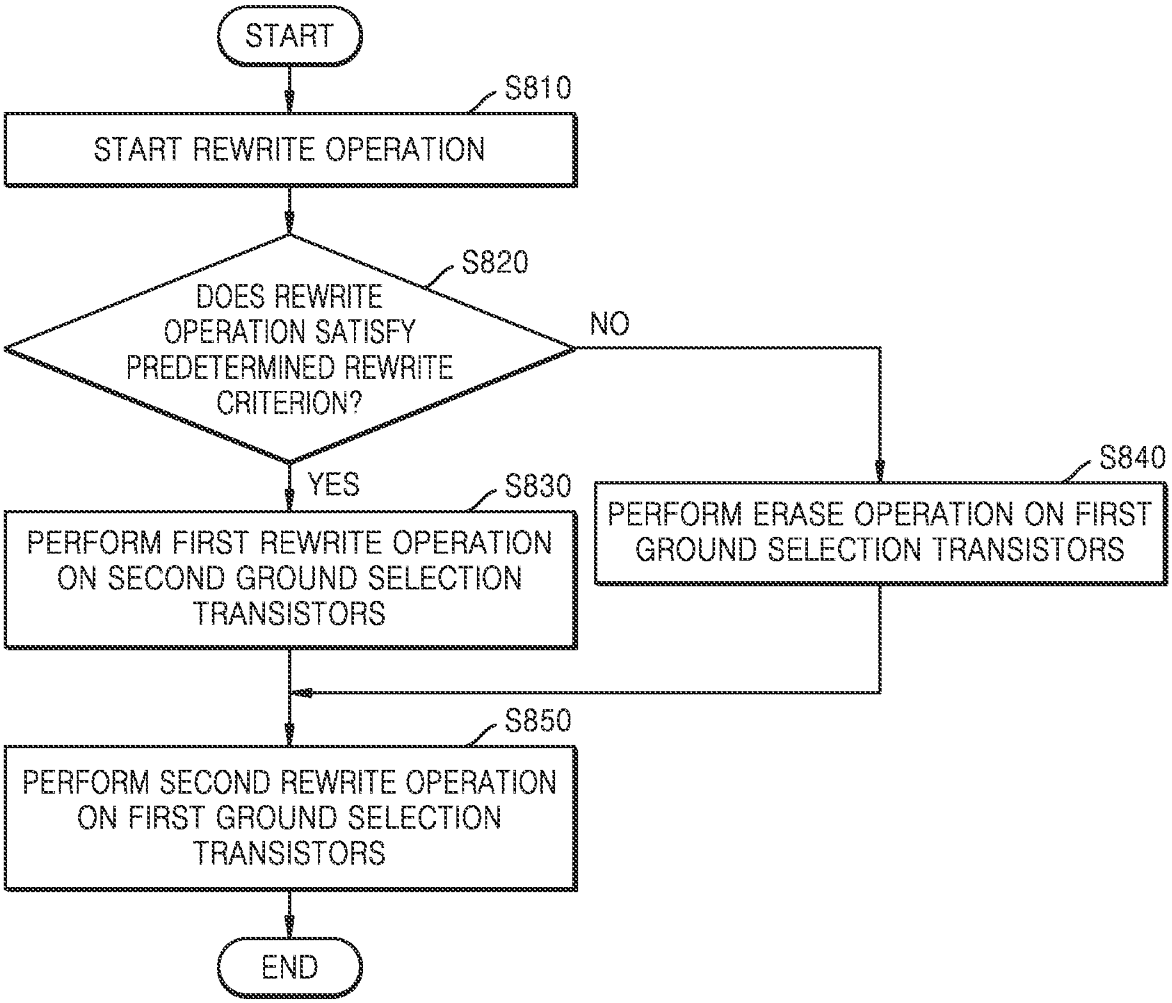

FIGS. 7 and 8 are flowcharts of a process of performing a rewrite operation in an operating method of a memory device, according to an example embodiment. FIG. 7 is a flowchart of a process of performing a rewrite operation when there are a plurality of transistors where programming of a threshold voltage according to an example embodiment has failed. FIG. 8 is a flowchart of a case where a rewrite operation is performed based on whether the rewrite operation satisfies a predetermined rewrite criterion, according to an example embodiment.

Referring to FIG. 7, the memory device 100 according to an example embodiment may perform a rewrite operation in operation S710. For example, the memory device 100 may determine whether programming of the first threshold voltage and programming of the second threshold voltage have succeeded and may perform a rewrite operation, based on a result of the determination.

When a rewrite operation starts, the memory device 100 according to an example embodiment may determine whether there are a plurality of transistors, having a region which is greater than the first criterion, of at least one first ground selection transistors in operation S720.

When it is determined that there are the plurality of transistors, having the region which is greater than the first criterion, of the at least one first ground selection transistors, the memory device 100 according to an example embodiment may perform a first rewrite operation on a plurality of second ground selection transistors in operation S730.

The first rewrite operation according to an example embodiment may be an operation of re-setting a threshold voltage of each of transistors connected with the programmed second ground selection line 111*b*.

When a voltage region of at least one transistor of transistors connected with the programmed first ground selection line 111*a* is greater than the first criterion, the memory device 100 according to an example embodiment may determine that programming of the first threshold voltage has failed and may perform a rewrite operation on the transistors connected with the programmed second ground selection line 111*b*. For example, when programming of the first threshold voltage and programming of the second threshold voltage have all failed, the amount of shift of the second threshold voltage may be greater than the amount of shift of the first threshold voltage in performing a rewrite operation. The memory device 100 according to an example embodiment may first perform a rewrite operation on the second threshold voltage where the amount of shift is relatively high.

However, when it is determined that there are no transistors, which have a region which is greater than the first criterion, of the at least one first ground selection transistors, the memory device 100 according to an example embodiment may perform an erase operation ERS on the first ground selection transistors in operation S740.

The memory device 100 according to an example embodiment may perform the erase operation ERS on all transistors connected with the programmed first ground selection line 111*a*. By performing the erase operation ERS on all of the transistors where programming of the first threshold voltage has succeeded and the transistors where programming of the first threshold voltage has failed, the memory device 100 according to an example embodiment may perform a stable rewrite operation and may maintain the robustness of a ground selection line.

When the erase operation ERS is performed on the first ground selection transistors, the memory device 100 according to an example embodiment may perform a second rewrite operation on the first ground selection transistors in operation S750.

The second rewrite operation may be an operation of re-setting a threshold voltage of each of the transistors connected with the programmed first ground selection line 111*a*. The amount of shift of a threshold voltage based on the first rewrite operation according to an example embodiment may be greater than the amount of shift of a threshold voltage based on the second rewrite operation.

The memory device 100 according to an example embodiment may perform a rewrite operation on the first threshold voltage where a rewrite operation on the second threshold voltage is completed and may thus perform a stable rewrite operation.

Referring to FIG. 8, the memory device 100 according to an example embodiment may perform a rewrite operation in operation S810. For example, the memory device 100 may determine whether programming of the first threshold voltage and programming of the second threshold voltage have succeeded and may perform a rewrite operation, based on a result of the determination.

When a rewrite operation starts, the memory device 100 according to an example embodiment may determine whether the rewrite operation satisfies a predetermined rewrite criterion in operation S820. The rewrite criterion according to an example embodiment may depend on whether an operation of performing a rewrite operation from transistors having a value where the amount of shift of a threshold voltage is high.

When it is determined that the rewrite operation satisfies the predetermined rewrite criterion, the memory device 100 according to an example embodiment may perform a first rewrite operation on a plurality of second ground selection transistors in operation S830.

The memory device 100 according to an example embodiment may perform the first rewrite operation on the transistors connected with the programmed second ground selection line 111*b* in operation S830. The first rewrite operation according to an example embodiment may be an operation of re-setting a threshold voltage of each of the transistors connected with the programmed second ground selection line 111*b*.

When a voltage region of at least one transistor of transistors connected with the programmed first ground selection line 111*a* is greater than the first criterion, the memory device 100 according to an example embodiment may determine that programming of the first threshold voltage has failed and may perform a rewrite operation on the transistors connected with the programmed second ground selection line 111*b*. For example, when programming of the first threshold voltage and programming of the second threshold voltage have all failed, the amount of shift of the second threshold voltage may be greater than the amount of shift of the first threshold voltage in performing a rewrite operation. The memory device 100 according to an example embodiment may first perform a rewrite operation on the second threshold voltage where the amount of shift is relatively high.

However, when it is determined that the rewrite operation is not performed based on the predetermined rewrite criterion, the memory device 100 according to an example embodiment may perform the erase operation ERS on the first ground selection transistors in operation S840. The memory device 100 according to an example embodiment may perform an erase operation ERS on all transistors connected with the programmed first ground selection line 111*a*. By performing the erase operation ERS on all of the transistors where programming of the first threshold voltage has succeeded and the transistors where programming of the first threshold voltage has failed, the memory device 100 according to an example embodiment may perform a stable rewrite operation and may maintain the robustness of a ground selection line.

When the erase operation ERS is performed on the first ground selection transistors, the memory device 100 according to an example embodiment may perform a second rewrite operation on the first ground selection transistors in operation S850.

The second rewrite operation may be an operation of re-setting the threshold voltage of each of the transistors connected with the programmed first ground selection line 111*a*.

The memory device 100 according to an example embodiment may perform a rewrite operation on the first threshold voltage where a rewrite operation on the second threshold voltage is completed and may thus perform a stable rewrite operation.

FIG. 9 is a diagram for describing an example embodiment of a case where a ground selection line of a memory device 100 according to an example embodiment is programmed.

Referring to FIG. 9, a word line of the memory device 100 according to an example embodiment may be programmed as a ground selection line.

For example, in a case where the memory device 100 is programmed by a first program Coded-GSL #1, a first word line WL0 may be a ground selection dummy line GMDY, and a second word line WL1 may be programmed as a ground selection line Coded-GSL. Also, a third word line WL2 may be the ground selection dummy line GMDY, and a fourth word line WL3 may be programmed as the ground selection line Coded-GSL. Also, a fifth word line may be the ground selection dummy line GMDY, and a sixth word line WL5 may be a main word line. The memory device 100 according to an example embodiment may include dummy lines DUM0 and DUM1.

In a case where the memory device 100 according to an example embodiment is programmed by a second program Coded-GSL #2, the first word line WL0 may be programmed as the ground selection line Coded-GSL. The second word line WL1 may be programmed as the ground selection dummy line GMDY. Also, the third word line WL2 may be the ground selection line Coded-GSL, and the fourth word line WL3 may be programmed as the ground selection line Coded-GSL. Also, the fifth word line may be the ground selection dummy line GMDY, and the sixth word line WL5 may be the main word line. In the memory device 100 according to an example embodiment, the first dummy line DUM0 of the dummy lines may be programmed as a dummy region, and the second dummy line DUM1 may be programmed as the ground selection line Coded-GSL.

In a case where the memory device 100 according to an example embodiment is programmed by a third program Coded-GSL #3, the first word line WL0 may be programmed as the ground selection line Coded-GSL. The second word line WL1 may be programmed as the ground selection dummy line GMDY. Also, the third word line WL2 may be the ground selection line Coded-GSL, and the fourth word line WL3 may be programmed as the ground selection dummy line GMDY. Also, the fifth word line may be the ground selection dummy line GMDY, and the sixth word line WL5 may be programmed as a main word line. In the memory device 100 according to an example embodiment, the first dummy line DUM0 of the dummy lines may be programmed as a dummy region, and the second dummy line DUM1 may be programmed as the ground selection dummy line GMDY.

In a case where the memory device 100 according to an example embodiment is programmed by a fourth program Coded-GSL #4, the first word line WL0 may be programmed as the ground selection dummy line GMDY. The second word line WL1 may be programmed as the ground selection line Coded-GSL. Also, the third word line WL2 may be the ground selection dummy line GMDY, and the fourth word line WL3 may be programmed as the ground selection line Coded-GSL. Also, the fifth word line may be the ground selection dummy line GMDY, and the sixth word line WL5 may be programmed as a main word line. In the memory device 100 according to an example embodiment, the first dummy line DUM0 of the dummy lines may be programmed as a dummy region, and the second dummy line DUM1 may be programmed as the ground selection line Coded-GSL.

A method of programming ground selection lines in the memory device 100 is not limited to the method illustrated in FIG. 9 and may include a plurality of programming methods.

Figure 10:
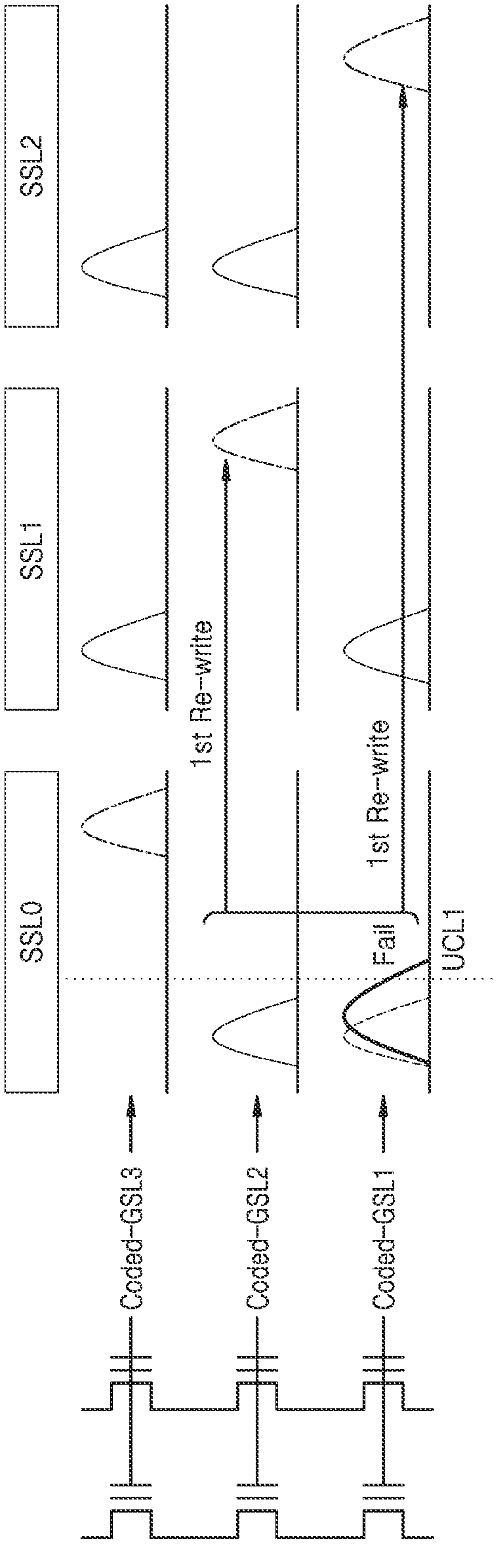
FIGS. 10 and 11 are diagrams for describing an example where a rewrite operation is performed on a first ground selection line, in a memory device according to an example embodiment.
Figure 11:
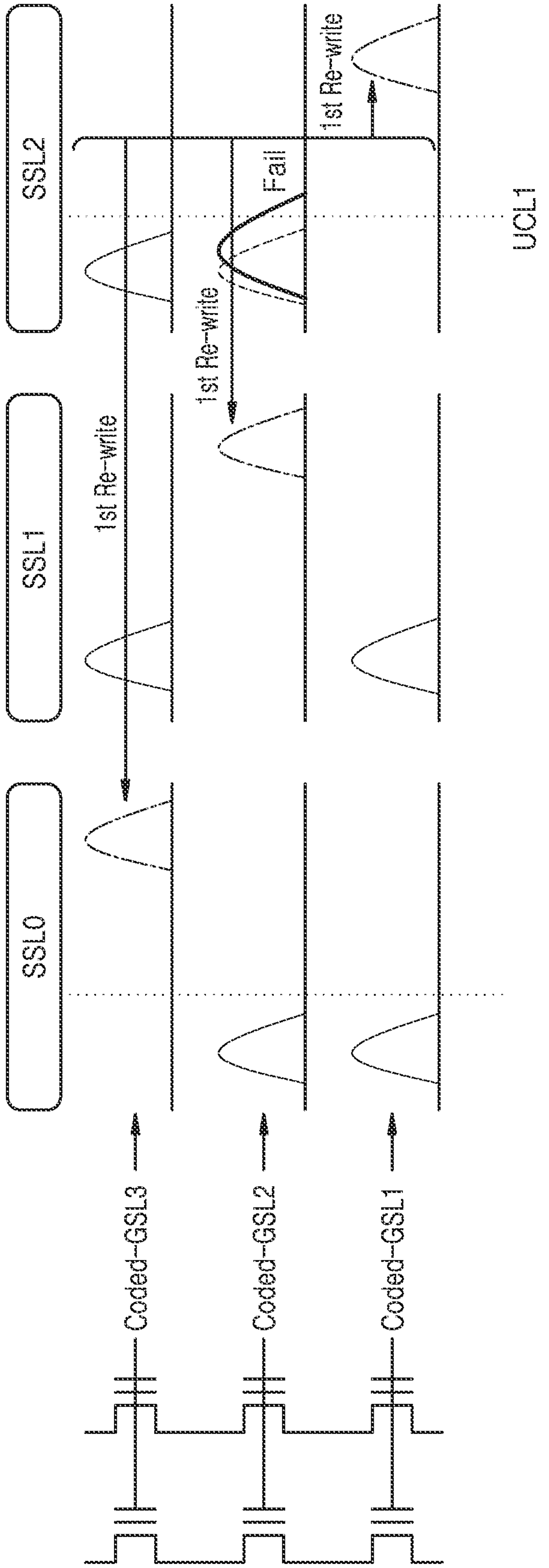

FIGS. 10 and 11 are diagrams for describing an example where a rewrite operation is performed on a first ground selection line, in a memory device 100 according to an example embodiment. Hereinafter, the terms "first", "second", and "third" used in FIGS. 10 to 13 may be for simply differentiating between string selection lines and ground selection lines.

Referring to FIG. 10, a word line block of a cell region selected by string selection lines (for example, first to third string selection lines) SSL0, SSL1, and SSL2 according to an example embodiment may include a plurality of programmed ground selection lines (for example, programmed first to third ground selection lines) Coded-GSL1, Coded-GSL2, and Coded-GSL3.

In a case where there is a region where a voltage region of a transistor of a programmed first ground selection line Coded-GSL1 of the first string selection line SSL0 according to an example embodiment is greater than a first criterion UCL1, the memory device 100 according to an example embodiment may perform a first rewrite operation ($1^{st}$ Re-write) on the transistor of the programmed first ground selection line Coded-GSL1. For example, the memory device 100 may determine that first threshold voltage programming of a transistor of the programmed first ground selection line Coded-GSL1 has failed and may perform the first rewrite operation ($1^{st}$ Re-write) on the transistor of a programmed first ground selection line Coded-GSL1 of the third string selection line SSL2.

In a case where a rewrite operation is performed on the transistor of the programmed first ground selection line Coded-GSL1, the memory device 100 according to an example embodiment may perform the first rewrite operation ($1^{st}$ Re-write) on a transistor of the programmed second ground selection line Coded-GSL2. In a case where the first rewrite operation ($1^{st}$ Re-write) is performed on the transistor of the programmed first ground selection line Coded-GSL1, the memory device 100 according to an example embodiment may perform the first rewrite operation ($1^{st}$ Re-write) on the transistor of the programmed second ground selection line Coded-GSL2 and may thus remove an adverse effect, caused by a variation of a threshold voltage, on an adjacent ground selection line.

Referring to FIG. 11, when it is determined that first threshold voltage programming of a programmed second ground selection line Coded-GSL2 of the third string selection line SSL2 of the memory device 100 according to an example embodiment has failed, the memory device 100 may perform the first rewrite operation ($1^{st}$ Re-write) on the programmed second ground selection line Coded-GSL2, the programmed first ground selection line Coded-GSL1 adjacent to the programmed second ground selection line Coded-GSL2, and the programmed third ground selection line Coded-GSL3.

In a case where there is a region where a voltage region of a transistor of a programmed second ground selection line Coded-GSL2 of a third string selection line SSL2 according to an example embodiment is greater than the first criterion UCL1, the memory device 100 according to an example embodiment may perform a first rewrite operation ($1^{st}$ Re-write) on the transistor of the programmed second ground selection line Coded-GSL2. For example, the memory device 100 may determine that first threshold voltage programming of the transistor of the programmed second ground selection line Coded-GSL2 has failed and may perform the first rewrite operation ($1^{st}$ Re-write) on a transistor of a programmed second ground selection line Coded-GSL2 of a second string selection line SSL1.

In a case where a rewrite operation is performed on the transistor of the programmed second ground selection line Coded-GSL2, the memory device 100 according to an example embodiment may perform the first rewrite operation ($1^{st}$ Re-write) on the transistor of each of the programmed first ground selection line Coded-GSL1 and the programmed third ground selection line Coded-GSL3. In a case where the first rewrite operation ($1^{st}$ Re-write) is performed on the transistor of the programmed second ground selection line Coded-GSL2, the memory device 100 according to an example embodiment may perform the first rewrite operation ($1^{st}$ Re-write) on the transistor of each of the programmed first ground selection line Coded-GSL1 and the programmed third ground selection line Coded-GSL3 and may thus remove an adverse effect, caused by a variation of a threshold voltage, on an adjacent ground selection line.

Figure 12:
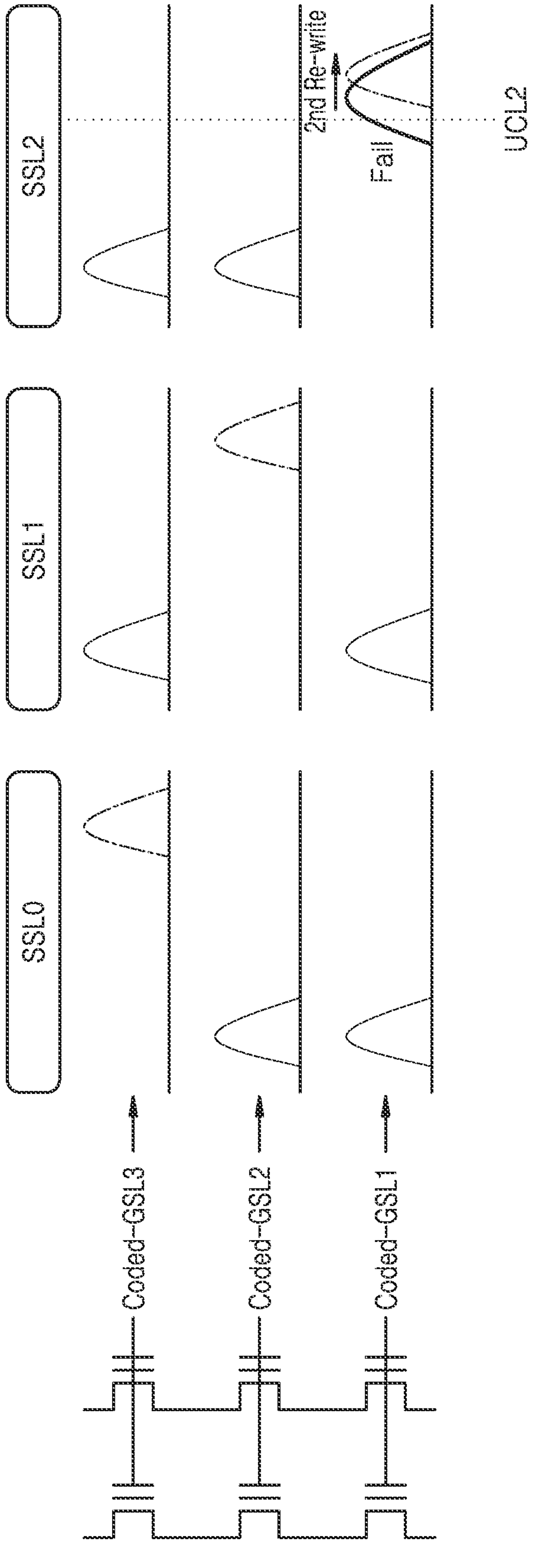
FIG. 12 is a diagram for describing an example where a rewrite operation is performed on a second ground selection line, in a memory device according to an example embodiment.

FIG. 12 is a diagram for describing an example where a rewrite operation is performed on a second ground selection line, in a memory device 100 according to an example embodiment.

Referring to FIG. 12, in a case where there is a region, which is less than the second criterion UCL2, of a voltage region of a transistor of a programmed first ground selection line Coded-GSL1 of a third string selection line SSL2, the memory device 100 according to an example embodiment may perform a second rewrite operation ($2^{nd}$ Re-write) on a transistor of a programmed first ground selection line Coded-GSL1. For example, the memory device 100 may determine that second threshold voltage programming of the transistor of the programmed first ground selection line Coded-GSL1 has failed and may perform the second rewrite operation ($2^{nd}$ Re-write) on the transistor of the programmed first ground selection line Coded-GSL1 of a third string selection line SSL2. The second rewrite operation ($2^{nd}$ Re-write) according to an example embodiment may not include a rewrite operation on transistors of an adjacent ground selection line.

Figure 13:
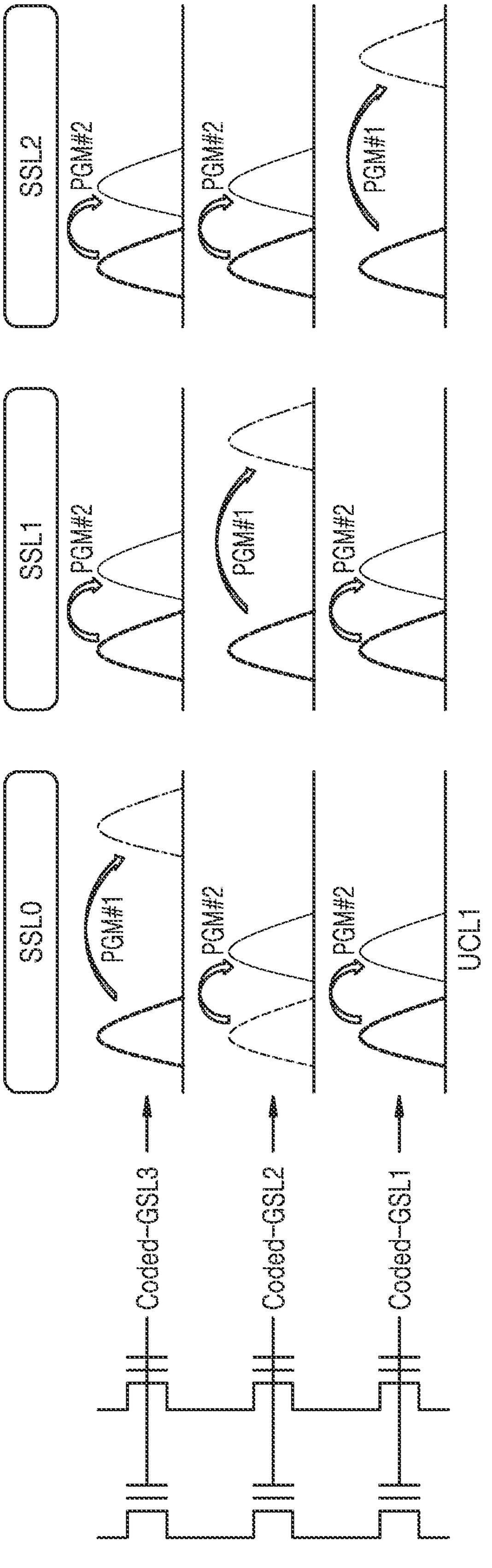
FIG. 13 is a diagram for describing an example where a rewrite operation is performed on a plurality of transistors of a memory device according to an example embodiment.

FIG. 13 is a diagram for describing an example where a rewrite operation is performed on a plurality of transistors of a memory device 100 according to an example embodiment.

Referring to FIG. 13, when it is determined that there are transistors, which have a region which is greater than the first criterion, of transistors connected with a programmed first ground selection line Coded-GSL1, a programmed second ground selection line Coded-GSL2, or a programmed third ground selection line Coded-GSL3, the memory device 100 according to an example embodiment may perform a first rewrite operation PGM #1 and a second rewrite operation PGM #2. The amount of shift of a threshold voltage based on the first rewrite operation PGM #1 according to an example embodiment may be greater than the amount of shift of a threshold voltage based on the second rewrite operation PGM #2.

When the first rewrite operation PGM #1 is completed, the memory device 100 according to an example embodiment may perform the second rewrite operation PGM #2. The memory device 100 according to an example embodiment may first perform a rewrite operation where the amount of shift of a threshold voltage is higher, and thus, may decrease an adverse effect, caused by a variation of the threshold voltage, on adjacent ground selection lines.

Figure 14:
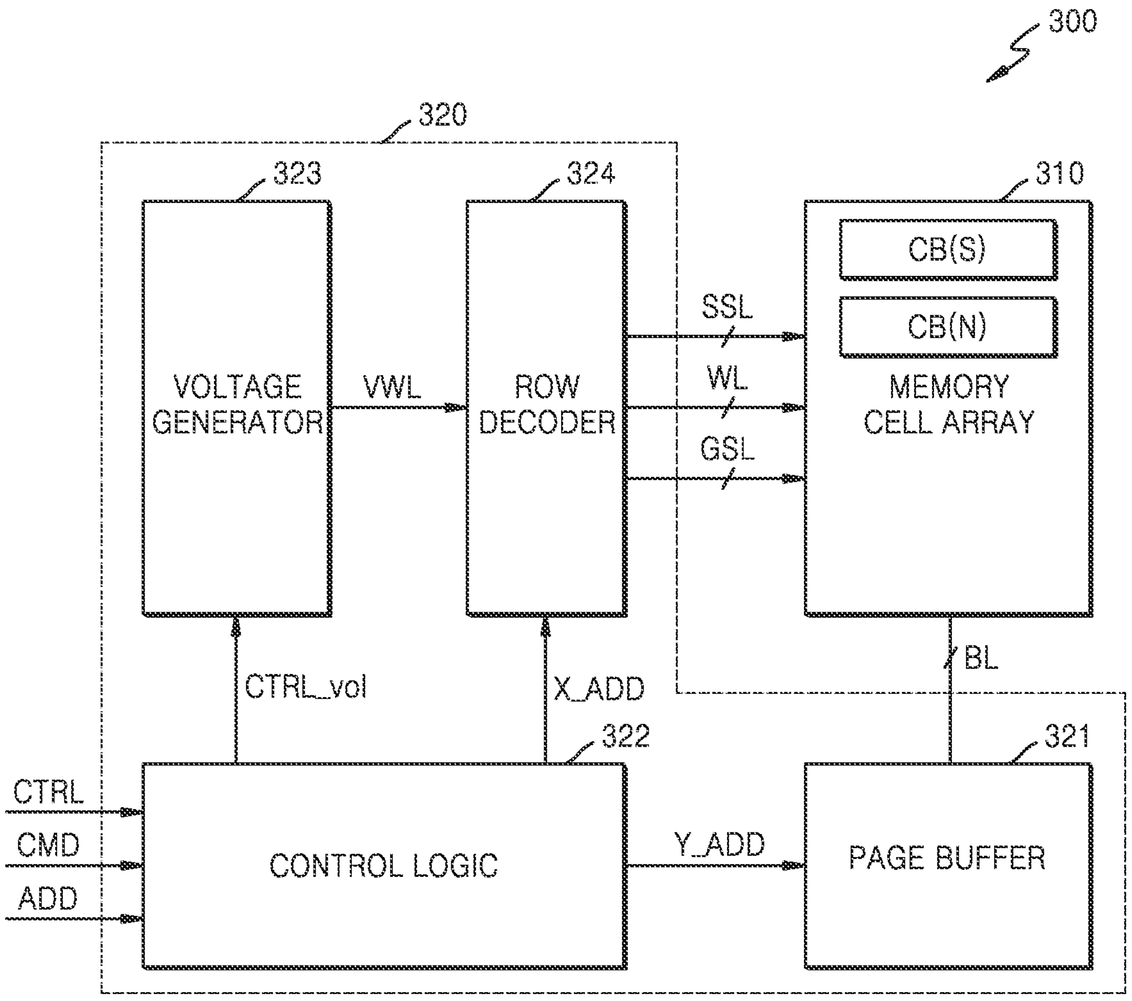
FIG. 14 is a block diagram of a memory device applicable to a programmed ground selection line, according to an example embodiment.

FIG. 14 is a block diagram of a memory device 300 applicable to a programmed ground selection line, according to an example embodiment.

Referring to FIG. 14, the memory device 300 may include a memory cell array 310 and a peripheral circuit 320, and the peripheral circuit 320 may include a page buffer 321, a control logic 322, a voltage generator 323, and a row decoder 324. The peripheral circuit 320 may further include various elements, such as a data input/output (I/O) circuit or an I/O interface.

The memory cell array 310 may be connected with the page buffer 321 through bit lines BL and may be connected with the row decoder 324 through word lines WL, string selection lines SSL, and ground selection lines GSL. The memory cell array 310 may include a plurality of cell blocks, and each of the plurality of cell blocks may include a plurality of cell strings. Also, the plurality of cell blocks of the memory cell array 310 may include a special cell block CB(S) and a normal cell block CB(N).

The control logic 322 may program data in the memory cell array 310, based on a command CMD, an address ADD, and a control signal CTRL, and may output various control signals (for example, a voltage control signal CTRL_vol, a row address X_ADD, and a column address Y_ADD) for reading data from the memory cell array 310. The control logic 322 may adjust a level of a voltage generated by the voltage generator 323.

The voltage generator 323 may generate various kinds of voltages for performing a program operation, a read operation, and an erase operation on the memory cell array 310, based on the voltage control signal CTRL_vol. In FIG. 4, it is illustrated that the voltage generator 323 generates a word line voltage VWL, and the word line voltage VWL may include a voltage provided to the word lines WL of the memory cell array 310, a voltage provided to the string selection line SSL, and a voltage provided to the ground selection line GSL.

According to an example embodiment, the special cell block CB(S) and the normal cell block CB(N) may have different structures. For example, a same number of lines connected with the row decoder 324 may be disposed in each of the special cell block CB(S) and the normal cell block CB(N), and more dummy lines and/or more ground selection lines may be disposed in the normal cell block CB(N) than a GSL region of the special cell block CB(S). Therefore, the number of word lines WL connected with memory cells, storing information or data, of the special cell block CB(S) may have a value which is less than the number of word lines WL of the normal cell block CB(N). That is, the number of memory cells storing information or data in the special cell block CB(S) may be less than the normal cell block CB(N).

Furthermore, the control logic 322 may control a voltage level for coding of a GSL region included in the special cell block CB(S) and the normal cell block CB(N). For example, based on control by the control logic 322, a program operation may be performed so that a level of each of threshold voltages of ground selection transistors included in the special cell block CB(S) differs from that of each of threshold voltages of ground selection transistors included in the normal cell block CB(N). Also, the control logic 322 may control a voltage control operation for adjusting a threshold voltage level of each of dummy cells included in the special cell block CB(S).

Figure 15:
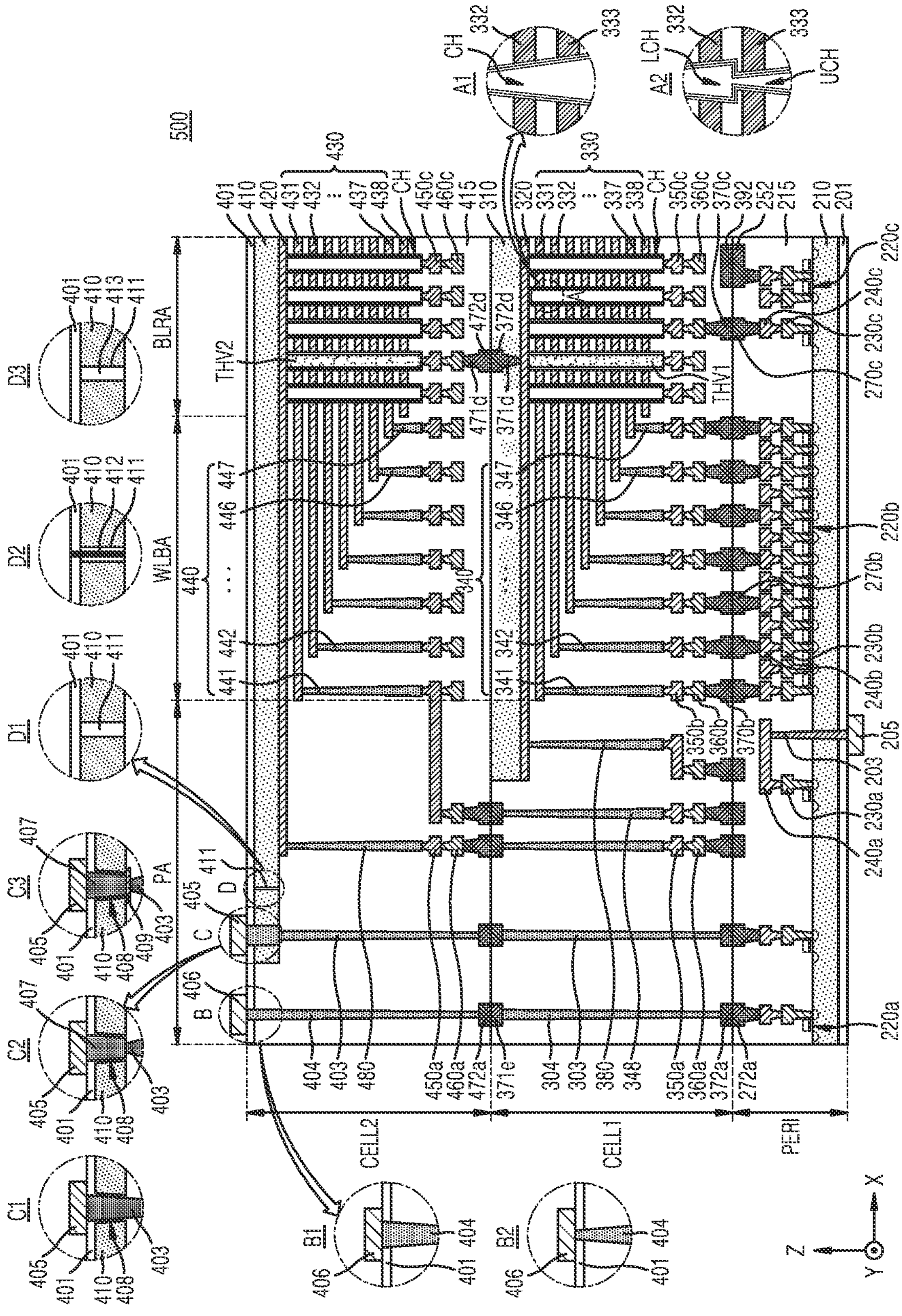
FIG. 15 is a cross-sectional view illustrating a memory device including a B-VNAND structure, according to an example embodiment.

FIG. 15 is a cross-sectional view illustrating a memory device 500 including a B-VNAND structure, according to an example embodiment.

FIG. 15 is a diagram for describing the memory device 500 according to an example embodiment.

Referring to FIG. 15, the memory device 500 may have a chip to chip (C2C) structure. Here, the C2C structure may denote that at least one upper chip including a cell region CELL and a lower chip including a peripheral circuit region PERI are each manufactured, and then, the at least one upper chip is connected with the at least one lower chip through a bonding process. For example, the bonding process may denote a process of electrically or physically connecting a bonding metal pattern, formed on an uppermost metal layer of the upper chip, with a bonding metal pattern formed on an uppermost metal layer of the lower chip. For example, in a case where the bonding metal patterns include copper (Cu), the bonding process may be a Cu—Cu bonding process. As another example, the bonding metal patterns may include aluminum (Al) or tungsten (W).

The memory device 500 may include one or more upper chips each including a cell region. For example, as illustrated in FIG. 15, the memory device 500 may be implemented to include two upper chips. However, this is provided as an example, and the number of upper chips is not limited thereto. In a case where the memory device 500 is implemented to include two upper chips, a first upper chip including a first cell region CELL1, a second upper chip including a second cell region CELL2, and a lower chip including the peripheral circuit region PERI may each be manufactured, and then, the first upper chip, the second upper chip, and the lower chip may be connected with one another by a bonding process, thereby manufacturing the memory device 500. The first upper chip may be reversed and connected with the lower chip by a bonding process, and the second upper chip may be reversed and connected with the first upper chip by a bonding process. In the following description, upper portions and lower portions of the first and second upper chips may be referred to with respect to a state before the first upper chip and the second upper chip are reversed. That is, in FIG. 15, an upper portion of the lower chip may denote an upper portion with respect to a +Z-axis direction, and an upper portion of each of the first and second upper chips may denote an upper portion with respect to a −Z-axis direction. However, this is provided as an example, and only one of the first upper chip and the second upper chip may be reversed and the first upper chip and the second upper chip may be connected with each other by a bonding process.

Each of the peripheral circuit region PERI and the first and second cell regions CELL1 and CELL2 of the memory device 500 may include an external pad bonding region PA, a word line bonding region WLBA, and a bit line bonding region BLBA.

The peripheral circuit region PERI may include a first substrate 210 and a plurality of circuit devices **220*a* to 220*c* provided on the first substrate 210. An interlayer insulation layer 215 including one or more insulation layers may be provided on the plurality of circuit devices 220*a* to 220*c*, and a plurality of metal wirings connecting the plurality of circuit devices 220***a* to 220*c* with one another may be provided in the interlayer insulation layer 215. For example, the plurality of metal wirings may include first metal wirings 230*a* to 230*c* respectively connected with the plurality of circuit devices 220*a* to 220*c* and second metal wirings 240*a* to 240*c* formed on the first metal wirings 230*a* to 230*c*. The plurality of metal wirings may include at least one of various conductive materials. For example, the first metal wirings 230*a* to 230*c* may include tungsten which is relatively high in electrical resistivity, and the second metal wirings 240*a* to 240*c* may include copper which is relatively low in electrical resistivity.

Herein, only the first metal wirings 230*a* to 230*c* and the second metal wirings 240*a* to 240*c* are illustrated, but example embodiments are not limited thereto and one or more additional metal wirings may be further formed on the second metal wirings 240*a* to 240*c*. In this case, the second metal wirings 240*a* to 240*c* may include aluminum. Also, at least a portion of each of the additional metal wirings formed on the second metal wirings 240*a* to 240*c* may include copper having electrical resistivity which is lower than that of aluminum of the second metal wirings 240*a* to 240*c*.

The interlayer insulation layer 215 may be disposed on the first substrate 210 and may include an insulating material such as silicon oxide or silicon nitride.

Each of the first and second cell regions CELL1 and CELL2 may include at least one memory block. The first cell region CELL1 may include a second substrate 310 and a common source line 320. A plurality of word lines 331 to 338 (330) may be stacked on the second substrate 310 in a direction (a Z-axis direction) perpendicular to an upper surface of the second substrate 310. String selection lines and a ground selection line may be disposed on and under the word lines 330, and a plurality of word lines 330 may be disposed between the string selection lines and the ground selection line. Likewise, the second cell region CELL2 may include a third substrate 410 and a common source line 420, and a plurality of word lines 431 to 438 (430) may be stacked on the third substrate 410 in a direction (the Z-axis direction) perpendicular to an upper surface of the third substrate 410. The second substrate 310 and the second substrate 410 may include various materials, and for example, may each be a substrate including a monocrystalline epitaxial layer grown on a silicon substrate, a silicon-germanium substrate, a germanium substrate, or a monocrystalline silicon substrate. A plurality of channel structures CH may be formed in each of the first and second cell regions CELL1 and CELL2.

In an example embodiment, as illustrated in A1, the channel structure CH may be provided in the bit line bonding region BLBA, and the channel structure CH may extend in a direction perpendicular to the upper surface of the third substrate 410 and may pass through the word lines 330, the string selection lines, and the ground selection line. The channel structure CH may include a data storage layer, a channel layer, and a buried insulation layer. The channel layer may be electrically connected with the first metal wiring 350*c* and the second metal wiring 360*c* in the bit line bonding region BLBA. For example, the second metal wiring 360*c* may be a bit line and may be connected with the channel structure CH through the first metal wiring 350*c*. The bit line 360*c* may extend in a first direction (a Y-axis direction) parallel to an upper surface of the second substrate 310.

In an example embodiment, as illustrated in A2, the channel structure CH may include a lower channel LCH and an upper channel UCH, which are connected with each other. For example, the channel structure CH may be formed through a process on the lower channel LCH and a process of the upper channel UCH. The lower channel LCH may extend in a direction perpendicular to the upper surface of the second substrate 310 and may pass through the common source line 320 and the lower word lines 331 and 332. The lower channel LCH may include a data storage layer, a channel layer, and a buried insulation layer and may be connected with the upper channel UCH. The upper channel UCH may pass through the upper word lines 333 to 338. The upper channel UCH may include a data storage layer, a channel layer, and a buried insulation layer, and the channel layer of the upper channel UCH may be electrically connected with the first metal wiring 350*c* and the second metal wiring 360*c*. As a length of a channel increases, it may be difficult to form a channel having a certain width for process reasons. The memory device 500 according to an example embodiment may include a channel having width uniformity improved through the lower channel LCH and the upper channel UCH, which are formed through sequential processes.

As illustrated in A2, in a case where the channel structure CH is formed to include the lower channel LCH and the upper channel UCH, a word line disposed at a boundary portion between the lower channel LCH and the upper channel UCH may be a dummy word line. For example, the word line 332 and the word line 333 each configuring a boundary between the lower channel LCH and the upper channel UCH may each be a dummy word line. In this case, data may not be stored in memory cells connected with the dummy word line. Alternatively, the number of pages corresponding to the memory cells connected with the dummy word line may be less than the number of pages corresponding to memory cells connected with a normal word line. A voltage level applied to the dummy word line may differ from a voltage level applied to the normal word line, and thus, a non-uniform channel width between the lower channel LCH and the upper channel UCH may decrease an adverse effect on a memory device.

Furthermore, in A2, it is illustrated that the number of lower word lines 331 and 332 through which the lower channel LCH passes is less than the number of upper word lines 333 to 338 through which the upper channel UCH passes. However, this is provided as an example, and example embodiments are not limited thereto. As another example, the number of lower word lines passing through the lower channel LCH may be greater than or equal to the number of upper word lines passing through the upper channel UCH. Also, a connection relationship and a structure of the channel structure CH disposed in the first cell region CELL1 described above may be identically applied to the channel structure CH disposed in the second cell region CELL2.

In the bit line bonding region BLBA, a first through via THV1 may be provided in the first cell region CELL1, and a second through via THV2 may be provided in the second cell region CELL2. As illustrated in FIG. 15, the first through via THV1 may pass through the common source line 320 and the plurality of word lines 330. However, this is provided as an example, and the first through via THV1 may further pass through the second substrate 310. The first through via THV1 may include a conductive material. Alternatively, the first through via THV1 may include a conductive material which is surrounded by an insulating material. The second through via THV2 may be provided in the same shape and structure as those of the first through via THV1.

In an example embodiment, the first through via THV1 and the second through via THV2 may be electrically connected with a first through metal pattern 372*d* and a second through metal pattern 472*d*. The first through metal pattern 372*d* may be formed at a lower end of the first upper chip including the first cell region CELL1, and the second through metal pattern 472*d* may be formed at an upper end of the second upper chip including the second cell region CELL2. The first through via THV1 may be electrically connected with the first metal wiring 350*c* and the second metal wiring 360*c*. A lower via 371*d* may be formed between the first through via THV1 and the first through metal pattern 372*d*, and an upper via 471*d* may be formed between the second through via THV2 and the second through metal pattern 472*d*. The first through metal pattern 372*d* may be connected with the second through metal pattern 472*d* by a bonding process.

Also, in the bit line bonding region BLBA, an upper metal pattern 252 may be formed on the uppermost metal layer of the peripheral circuit region PERI, and an upper metal pattern 392 having the same shape as that of the upper metal pattern 252 may be formed on the uppermost metal layer of the first cell region CELL1. The upper metal pattern 392 of the first cell region CELL1 may be electrically connected with the upper metal pattern 252 of the peripheral circuit region PERI by a bonding process. In the bit line bonding region BLBA, a bit line 360*c* may be electrically connected with a page buffer included in the peripheral circuit region PERI. For example, some of the circuit devices 220*c* of the peripheral circuit region PERI may provide the page buffer, and the bit line 360*c* may be electrically connected with the circuit devices 220*c*, providing the page buffer, through the upper bonding metal 370*c* of the first cell region CELL1 and the upper bonding metal 270*c* of the peripheral circuit region PERI.

Continuously, referring to FIG. 15, in the word line bonding region WLBA, the word lines 330 of the first cell region CELL1 may extend in a second direction (an X-axis direction) parallel to the upper surface of the second substrate 310 and may be connected with a plurality of cell contact plugs 341 to 347 (340). A first metal wiring 350*b* and a second metal wiring 360*b* may be sequentially connected with upper portions of the cell contact plugs 340 connected with the word lines 330. The cell contact plugs 340 may be connected with the peripheral circuit region PERI through the upper bonding metal 370*b* of the first cell region CELL1 and the upper bonding metal 270*b* of the peripheral circuit region PERI, in the word line bonding region WLBA.

The cell contact plugs 340 may be electrically connected with a row decoder included in the peripheral circuit region PERI. For example, some of the circuit devices 220*b* of the peripheral circuit region PERI may provide the row decoder, and the cell contact plugs 340 may be electrically connected with the circuit devices 220*b*, providing the row decoder, through the upper bonding metal 370*b* of the first cell region CELL1 and the upper bonding metal 270*b* of the peripheral circuit region PERI. In an example embodiment, an operation voltage of each of the circuit devices 220*b* providing the row decoder may differ from that of each of the circuit devices 220*c* providing the page buffer. For example, the operation voltage of each of the circuit devices 220*c* providing the page buffer may differ from that of each of the circuit devices 220*b* providing the row decoder.

Likewise, in the word line bonding region WLBA, the word lines 430 of the second cell region CELL2 may extend in the second direction (the X-axis direction) parallel to an upper surface of the third substrate 410 and may be connected with a plurality of cell contact plugs 441 to 447 (440). The cell contact plugs 440 may be connected with the peripheral circuit region PERI through an upper metal pattern of the second cell region CELL2, a lower metal pattern and an upper metal pattern of the first cell region CELL1, and the cell contact plug 348.

In the word line bonding region WLBA, the upper bonding metal 370*b* may be formed in the first cell region CELL1, and the upper bonding metal 270*b* may be formed in the peripheral circuit region PERI. The upper bonding metal 370*b* of the first cell region CELL1 and the upper bonding metal 270*b* of the peripheral circuit region PERI may be electrically connected with each other by a bonding process. The upper bonding metal 370*b* and the upper bonding metal 270*b* may include aluminum, copper, or tungsten.

In the external pad bonding region PA, a lower metal pattern 371*e* may be formed at a lower portion of the first cell region CELL1, and an upper metal pattern 472*a* may be formed at an upper portion of the second cell region CELL2. The lower metal pattern 371*e* of the first cell region CELL1 may be connected with the upper metal pattern 472*a* of the second cell region CELL2 by a bonding process, in the external pad bonding region PA. Likewise, an upper metal pattern 372*a* may be formed at an upper portion of the first cell region CELL1, and an upper metal pattern 272*a* may be formed at an upper portion of the peripheral circuit region PERI. The upper metal pattern 372*a* of the first cell region CELL1 may be connected with the upper metal pattern 272*a* of the peripheral circuit region PERI by a bonding process.

Common source line contact plugs 380 and 480 may be disposed in the external pad bonding region PA. The common source line contact plugs 380 and 480 may include a conductive material such as metal, a metal compound, or doped polysilicon. The common source line contact plug 380 of the first cell region CELL1 may be electrically connected with the common source line 320, and the common source line contact plug 480 of the second cell region CELL2 may be electrically connected with the common source line 420. The first metal wiring 350*a* and the second metal wiring 360*a* may be sequentially stacked on the common source line contact plug 380 of the first cell region CELL1, and the first metal wiring 450*a* and the second metal wiring 460*a* may be sequentially stacked on the common source line contact plug 480 of the second cell region CELL2.

A plurality of I/O pads (for example, first to third I/O pads) 205, 405, and 406 may be disposed in the external pad bonding region PA. Referring to FIG. 15, a lower insulation layer 201 may cover a lower surface of the first substrate 210, and the first I/O pad 205 may be formed on the lower insulation layer 201. The first I/O pad 205 may be connected with, through the first I/O contact plug 203, at least one of the plurality of circuit devices 220*a* disposed in the peripheral circuit region PERI and may be isolated from the first substrate 210 by the lower insulation layer 201. Also, a side insulation layer may be disposed between the first I/O contact plug 203 and the first substrate 210 and may electrically disconnect the first I/O contact plug 203 from the first substrate 210.

An upper insulation layer 401 covering an upper surface of the third substrate 410 may be formed on the third substrate 410. The second I/O pad 405 and/or the third I/O pad 406 may be disposed on the upper insulation layer 401. The second I/O pad 405 may be connected with, through the second I/O contact plugs 403 and 303, at least one of the plurality of circuit devices 220*a* disposed in the peripheral circuit region PERI, and the third I/O pad 406 may be connected with, through the third I/O contact plugs 404 and 304, at least one of the plurality of circuit devices 220*a* disposed in the peripheral circuit region PERI.

In an example embodiment, the third substrate 410 may not be disposed in a region where an I/O contact plug is disposed. For example, as illustrated in B, the third I/O contact plug 404 may be isolated from the third substrate 410 in a direction parallel to the upper surface of the third substrate 410 and may be connected with the third I/O pad 406 via the interlayer insulation layer 415 of the second cell region CELL2. In this case, the third I/O contact plug 404 may be formed by various processes.

For example, as illustrated in B1, the third I/O contact plug 404 may extend in a third direction (a Z-axis direction) and may have a diameter which increases progressively toward the upper insulation layer 401. That is, a diameter of the channel structure CH described in A1 may decrease progressively toward the upper insulation layer 401, and a diameter of the third I/O contact plug 404 may increase progressively toward the upper insulation layer 401. For example, the third I/O contact plug 404 may be formed after the second cell region CELL2 is bonded to the first cell region CELL1 by a bonding process.

Also, for example, as illustrated in B2, the third I/O contact plug 404 may extend in the third direction (the Z-axis direction) and may have a diameter which decreases progressively toward the upper insulation layer 401. That is, like the channel structure CH, a diameter of the third I/O contact plug 404 may be formed to decrease progressively toward the upper insulation layer 401. For example, the third I/O contact plug 404 may be formed along with the cell contact plugs 440 before the second cell region CELL2 is bonded to the first cell region CELL1.

In another example embodiment, an I/O contact plug may be disposed to overlap the third substrate 410. For example, as illustrated in C, the second I/O contact plug 403 may be formed to pass through the interlayer insulation layer 415 of the second cell region CELL2 in the third direction (the Z-axis direction) and may be electrically connected with the second I/O pad 405 through the third substrate 410. In this case, a connection structure between the second I/O contact plug 403 and the second I/O pad 405 may be implemented as various types.

For example, as illustrated in C1, an opening portion 408 passing through the third substrate 410 may be formed, and the second I/O contact plug 403 may be directly connected with the second I/O pad 405 through the opening portion 408 formed in the third substrate 410. In this case, as illustrated in C1, a diameter of the second I/O contact plug 403 may increase progressively toward the second I/O pad 405. However, this is provided as an example, and a diameter of the second I/O contact plug 403 may decrease progressively toward the second I/O pad 405.

For example, as illustrated in C2, the opening portion 408 passing through the third substrate 410 may be formed, and a contact 407 may be formed in the opening portion 408. One end portion of the contact 407 may be connected with the second I/O pad 405, and the other end portion may be connected with the second I/O contact plug 403. Accordingly, the second I/O contact plug 403 may be electrically connected with the second I/O pad 405 through the contact 407 of the opening portion 408. In this case, as illustrated in C2, a diameter of the contact 407 may increase progressively toward the second I/O pad 405, and a diameter of the second I/O contact plug 403 may decrease progressively toward the second I/O pad 405. For example, the third I/O contact plug 404 may be formed along with the cell contact plugs 440 before the second cell region CELL2 is bonded to the first cell region CELL1, and the contact 407 may be formed after the second cell region CELL2 is bonded to the first cell region CELL1.

Also, for example, as illustrated in C3, a stopper 409 may be further formed on an upper surface of the opening portion 408 of the third substrate 410 unlike C2. The stopper 409 may be a metal wiring which is formed on the same layer as the common source line 420. However, this is provided as an example, and the stopper 409 may be a metal wiring which is formed on the same layer as at least one of the word lines 430. The second I/O contact plug 403 may be electrically connected with the second I/O pad 405 through the contact 407 and the stopper 409.

Furthermore, similarly to the second and third I/O contact plugs 403 and 404 of the second cell region CELL2, each of the second and third I/O contact plugs 303 and 304 of the first cell region CELL1 may have a diameter which decreases progressively toward the lower metal pattern 371*e*, or may have a diameter which increases progressively toward the lower metal pattern 371*e*.

Furthermore, according to example embodiments, a slit 411 may be formed in the third substrate 410. For example, the slit 411 may be formed at an arbitrary position of the external pad bonding region PA. For example, as illustrated in D, as seen in a plan view, the slit 411 may be disposed between the second I/O pad 405 and the cell contact plugs 440. However, this is provided as an example, and as seen in a plan view, the slit 411 may be formed so that the second I/O pad 405 is disposed between the slit 411 and the cell contact plugs 440.

For example, as illustrated in D1, the slit 411 may be formed to pass through the third substrate 410. The slit 411, for example, may be used for preventing the third substrate 410 from being finely cracked when forming the opening portion 408. However, this is provided as an example, and the slit 411 may be formed to have a depth of about 60% to about 70% with respect to a thickness of the third substrate 410.

Also, for example, as illustrated in D2, a conductive material 412 may be formed in the slit 411. The conductive material 412, for example, may be used for discharging a leakage current occurring when circuit devices of the external pad bonding region PA are being driven. In this case, the conductive material 412 may be connected with an external ground line.

Also, for example, as illustrated in D3, an insulating material 413 may be formed in the slit 411. The insulating material 413, for example, may be formed for electrically disconnecting the word line bonding region WLBA from the second I/O pad 405 and the second I/O contact plug 403 each disposed in the external pad bonding region PA. The insulating material 413 may be formed in the slit 411, and thus, may prevent a voltage supplied through the second I/O pad 405 from adversely affecting a metal layer disposed on the third substrate 410 of the voltage word line bonding region WLBA.

Furthermore, according to example embodiments, the first to third I/O pads 205, 405, and 406 may be selectively formed. For example, the memory device 500 may be implemented to include only the first I/O pad 205 disposed on the first substrate 210, include only the second I/O pad 405 disposed on the third substrate 410, or include only the third I/O pad 406 disposed on the upper insulation layer 401.

Furthermore, according to example embodiments, at least one of the second substrate 310 of the first cell region CELL1 and the third substrate 410 of the second cell region CELL2 may be used as a sacrificial substrate, and all or only a portion thereof may be removed before or after a bonding process. An additional layer may be stacked after a substrate is removed. For example, the second substrate 310 of the first cell region CELL1 may be removed before or after the peripheral circuit region PERI is bonded to the first cell region CELL1, and a conductive layer for connection or an insulation layer covering an upper surface of the common source line 320 may be formed. Similarly, the third substrate 410 of the second cell region CELL2 may be removed before or after the first cell region CELL1 is bonded to the second cell region CELL2, and a conductive layer for connection or an upper insulation layer 401 covering the upper surface of the common source line 320 may be formed.

Figure 16:
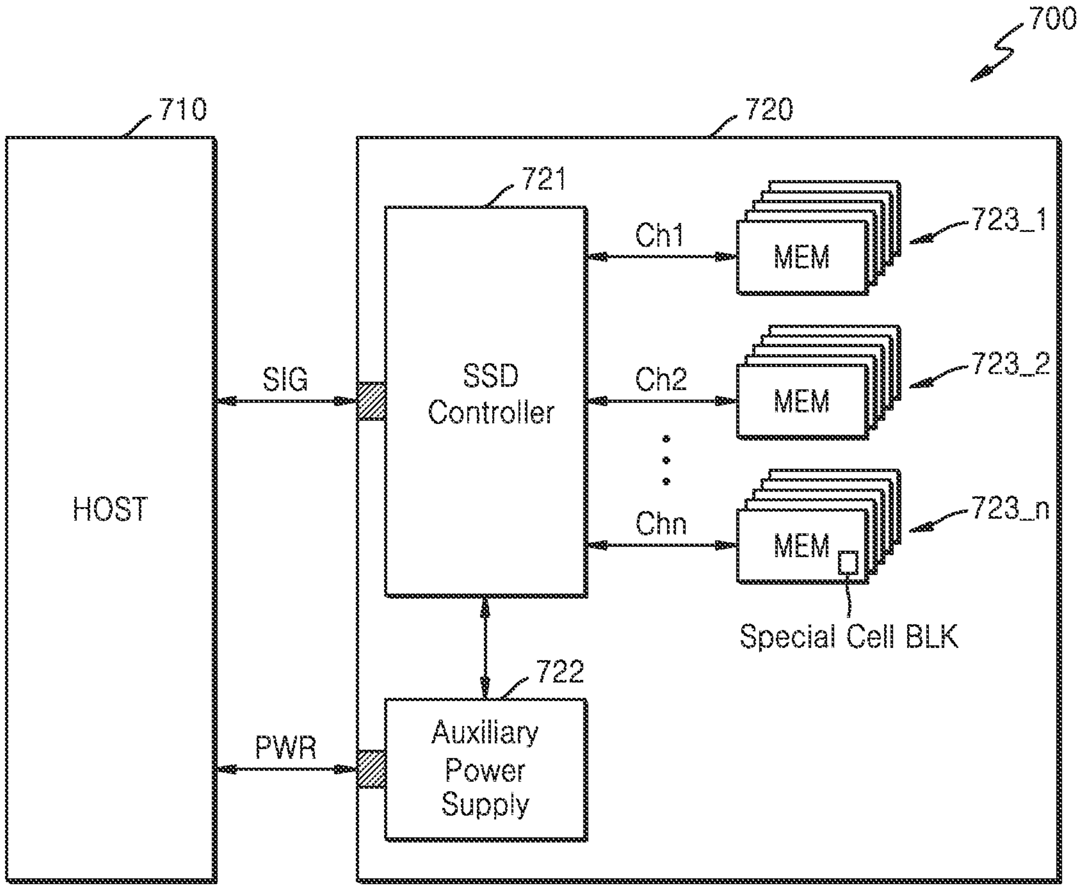
FIG. 16 is a block diagram illustrating an example where a memory device according to an example embodiment is applied to a solid state drive (SSD) system.

FIG. 16 is a block diagram illustrating an example where a memory device according to an example embodiment is applied to a solid state drive (SSD) system 700.

Referring to FIG. 16, the SSD system 700 may include a host 710 and an SSD 720. The SSD 720 may transmit or receive a signal to or from a host through a signal connector and may be supplied with power through a power connector. The SSD 720 may include an SSD controller 721, an auxiliary power supply 722, and memory devices 723_1 to 723_*n*. The memory devices 723_1 to 723_*n* may each be a vertical stack type NAND flash memory device. In this case, the SSD 720 may be implemented by using the example embodiments described above with reference to FIGS. 1 to 14. That is, each of the memory devices 723_1 to 723_*n* may include a plurality of cell blocks, and at least one of the plurality of cell blocks may correspond to a special cell block. Also, a GSL region included in the special cell block may have a structure illustrated in FIGS. 1 to 15, or GSL region coding may be performed based on a method illustrated in FIGS. 1 to 15.

In some example embodiments, each of the components represented by a block as illustrated in FIGS. 1, 4, 14, and 16 may be implemented as various numbers of hardware, software and/or firmware structures that execute respective functions described above, according to example embodiments. For example, at least one of these components may include various hardware components including a digital circuit, a programmable or non-programmable logic device or array, an application specific integrated circuit (ASIC), transistors, capacitors, logic gates, or other circuitry using use a direct circuit structure, such as a memory, a processor, a logic circuit, a look-up table, etc., that may execute the respective functions through controls of one or more microprocessors or other control apparatuses. Also, at least one of these components may include a module, a program, or a part of code, which contains one or more executable instructions for performing specified logic functions, and executed by one or more microprocessors or other control apparatuses. Also, at least one of these components may further include or may be implemented by a processor such as a central processing unit (CPU) that performs the respective functions, a microprocessor, or the like. Functional aspects of example embodiments may be implemented in algorithms that execute on one or more processors. Furthermore, the components, elements, modules or units represented by a block or processing steps may employ any number of related art techniques for electronics configuration, signal processing and/or control, data processing and the like.

While aspect of example embodiments have been particularly shown and described, it will be understood that various changes in form and details may be made therein without departing from the spirit and scope of the following claims.

What is claimed is:

1. A memory device comprising:
a plurality of memory cells respectively connected with a plurality of word lines;
a plurality of first ground selection transistors connected with a first ground selection line that is programmed to have a first threshold voltage;
a plurality of second ground selection transistors connected with a second ground selection line that is programmed to have a second threshold voltage which differs from the first threshold voltage; and
a control circuit configured to:
control an erase operation to be performed on each of at least one first ground selection transistor of the plurality of first ground selection transistors based on a threshold voltage of each of the at least one first ground selection transistor being greater than a predetermined first criterion; and
control a threshold voltage of each of the plurality of second ground selection transistors to be compared with a predetermined second criterion based on the erase operation on the at least one first ground selection transistor being completed.

2. The memory device of claim 1, wherein the control circuit is further configured to, based on the erase operation on the at least one first ground selection transistor being completed, control a rewrite operation to be performed on at least one first ground selection transistor each including a voltage region which is less than the predetermined first criterion.

3. The memory device of claim 1, wherein the control circuit is further configured to, based on a voltage region of each of the at least one first ground selection transistor being less than the predetermined first criterion, control the erase operation to be performed on the at least one first ground selection transistor.

4. The memory device of claim 1, wherein the control circuit is further configured to:
based on there being transistors, which each include a region which is greater than the predetermined first criterion, of the at least one first ground selection transistor, control a first rewrite operation to be performed on the plurality of second ground selection transistors; and
based on the first rewrite operation being completed, control a second rewrite operation to be performed on the at least one first ground selection transistor.

5. The memory device of claim 1, wherein the control circuit is further configured to:
based on a rewrite operation being performed based on a predetermined rewrite criterion, control a first rewrite operation to be performed on the plurality of second ground selection transistors; and
based on the first rewrite operation being completed, control a second rewrite operation to be performed on the at least one first ground selection transistor.

6. The memory device of claim 1, wherein the memory device comprises a three-dimensional memory.

7. An operating method of a memory device including memory blocks, each of the memory blocks including a plurality of cell strings connected in parallel between a bit line and a common source line, the operating method comprising:

programming a plurality of first ground selection transistors connected with a first ground selection line to have a first threshold voltage;

programming a plurality of second ground selection transistors connected with a second ground selection line to have a second threshold voltage which differs from the first threshold voltage;

based on a threshold voltage of each of at least one first ground selection transistor of the plurality of first ground selection transistors being greater than a predetermined first criterion, performing an erase operation each of on the at least one first ground selection transistor; and based on the erase operation on the at least one first ground selection transistor being completed, controlling a threshold voltage of each of the plurality of second ground selection transistors to be compared with a predetermined second criterion.

8. The operating method of claim 7, wherein the performing of the erase operation on the at least one first ground selection transistor comprises, based on the erase operation on the at least one first ground selection transistor being completed, performing a rewrite operation on at least one first ground selection transistor each including a voltage region which is less than the predetermined first criterion.

9. The operating method of claim 7, wherein the performing of the erase operation on the at least one first ground selection transistor comprises, based on a voltage region of each of the at least one first ground selection transistor being less than the predetermined first criterion, performing the erase operation on the at least one first ground selection transistor.

10. The operating method of claim 7, wherein the performing of the erase operation on the at least one first ground selection transistor comprises, based on a voltage region of each of the plurality of second ground selection transistors being less than the predetermined second criterion, performing the erase operation on the plurality of second ground selection transistors.

11. The operating method of claim 10, wherein the performing of the erase operation on the at least one first ground selection transistor comprises, based on the erase operation being performed on the plurality of second ground selection transistors, performing a rewrite operation on the plurality of second ground selection transistors on which the erase operation is completed.

12. The operating method of claim 7, wherein the performing of the erase operation on the at least one first ground selection transistor comprises:

performing a first rewrite operation on the plurality of second ground selection transistors based on at least one first ground selection transistor having a region which is greater than the predetermined first criterion; and performing a second rewrite operation on the at least one first ground selection transistor based on the first rewrite operation being completed.

13. The operating method of claim 7, wherein the performing of the erase operation on the at least one first ground selection transistor comprises:

performing a first rewrite operation on the plurality of second ground selection transistors based on a rewrite operation being performed according to a predetermined rewrite criterion; and performing a second rewrite operation on the at least one first ground selection transistor based on the first rewrite operation being completed.

14. A memory device comprising:

a plurality of memory cells respectively connected with a plurality of word lines;

a plurality of first ground selection transistors connected with a first ground selection line and programmed to have a first threshold voltage;

a plurality of second ground selection transistors connected with a second ground selection line and programmed to have a second threshold voltage which differs from the first threshold voltage; and a control circuit configured to, based on a voltage region of at least one transistor of the plurality of second ground selection transistors being less than a predetermined second criterion, control an erase operation to be performed on each of plurality of second ground selection transistors that includes a region which is less than the predetermined second criterion.

15. The memory device of claim 14, wherein the control circuit is further configured to, based on the erase operation being performed on the plurality of second ground selection transistors that include the voltage region less than the predetermined second criterion, control a rewrite operation to be performed on the plurality of second ground selection transistors on which the erase operation has been performed.

16. The memory device of claim 14, wherein the control circuit is further configured to, based on a voltage region of each of the at least one first ground selection transistor being less than a predetermined first criterion, control the erase operation to be performed on each of the at least one first ground selection transistor.

17. The memory device of claim 16, wherein the control circuit is further configured to, based on the erase operation on the at least one first ground selection transistor being completed, control a rewrite operation to be performed on each of at least one first ground selection transistor that includes a voltage region which is less than the predetermined first criterion.

18. The memory device of claim 14, wherein the control circuit is further configured to:

based on at least one first ground selection transistor having a region which is greater than a predetermined first criterion, control a first rewrite operation to be performed on the plurality of second ground selection transistors; and based on the first rewrite operation being completed, control a second rewrite operation to be performed on the at least one first ground selection transistor.

19. The memory device of claim 14, wherein the control circuit is further configured to:

based on a rewrite operation being performed according to a predetermined rewrite criterion, control a first rewrite operation to be performed on the plurality of second ground selection transistors; and based on the first rewrite operation being completed, control a second rewrite operation to be performed on the at least one first ground selection transistor.

20. The memory device of claim 14, wherein the memory device comprises a three-dimensional memory.

* * * * *